US010319728B2

(12) United States Patent
Ho et al.

(10) Patent No.: US 10,319,728 B2
(45) Date of Patent: *Jun. 11, 2019

(54) FLUID EJECTION DEVICES COMPRISING MEMORY CELLS

(71) Applicant: HEWLETT-PACKARD DEVELOPMENT COMPANY, L.P., Houston, TX (US)

(72) Inventors: Chaw Sing Ho, Singapore (SG); Reynaldo V. Villavelez, Corvallis, OR (US); Xin Ping Cao, Singapore (SG)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 79 days.

This patent is subject to a terminal disclaimer.

(21) Appl. No.: 15/379,286

(22) Filed: Dec. 14, 2016

(65) Prior Publication Data

US 2017/0092653 A1 Mar. 30, 2017

Related U.S. Application Data

(63) Continuation of application No. 14/397,571, filed as application No. PCT/US2012/062755 on Oct. 31, 2012, now Pat. No. 9,559,106.

(51) Int. Cl.
*H01L 27/11524* (2017.01)
*H01L 27/11521* (2017.01)
(Continued)

(52) U.S. Cl.
CPC ....... *H01L 27/11521* (2013.01); *B41J 2/1433* (2013.01); *H01L 21/28273* (2013.01);
(Continued)

(58) Field of Classification Search
CPC ......... H01L 21/28273; H01L 27/11517; H01L 27/11521; H01L 29/42324; H01L 29/513;
(Continued)

(56) References Cited

U.S. PATENT DOCUMENTS 5,619,052 A 4/1997 Chang et al.
6,362,508 B1 3/2002 Rasovsky et al.
(Continued)

FOREIGN PATENT DOCUMENTS

WO WO-2012125162 9/2012

OTHER PUBLICATIONS

Korean Intellectual Property Office, International Search Report and Written Opinion for PCT/US2012/062755 dated Oct. 31, 2012 (12 pages).

*Primary Examiner* — Duy T Nguyen
(74) *Attorney, Agent, or Firm* — HP Inc. Patent Department

(57) ABSTRACT

In some examples, a fluid ejection device includes a substrate and a memory cell on the substrate, the memory cell including a first dielectric layer, a floating gate, a second dielectric layer, and a control gate. The memory cell includes a channel region between a drain region and a source region. The first dielectric layer is over the channel region and the floating gate is capacitively coupled to the channel region through the first dielectric layer. The floating gate includes a polysilicon layer, a metal layer, and a second dielectric layer between the polysilicon layer and the metal layer, where the second dielectric layer includes an opening through which the polysilicon layer is electrically connected to the metal layer.

20 Claims, 21 Drawing Sheets

(51) Int. Cl.
  *H01L 29/788* (2006.01)
  *H01L 29/423* (2006.01)
  *B41J 2/14* (2006.01)
  *H01L 21/28* (2006.01)
  *H01L 29/51* (2006.01)

(52) U.S. Cl.
  CPC .. *H01L 27/11524* (2013.01); *H01L 29/42324* (2013.01); *H01L 29/513* (2013.01); *H01L 29/518* (2013.01); *H01L 29/788* (2013.01); *H01L 29/7881* (2013.01)

(58) Field of Classification Search
  CPC .............. H01L 29/518; H01L 29/7881; H01L 27/11524; H01L 29/788
  USPC ...................................................... 257/316
  See application file for complete search history.

(56) References Cited

U.S. PATENT DOCUMENTS

| | | |
|---|---|---|
| 2004/0185647 A1 | 9/2004 | Dong et al. |
| 2006/0211187 A1 | 9/2006 | Choi |
| 2007/0020831 A1 | 1/2007 | Chindalore |
| 2009/0001595 A1 | 1/2009 | Roessner |
| 2011/0037119 A1 | 2/2011 | Kong |
| 2011/0147826 A1 | 6/2011 | Weimer |
| 2011/0183509 A1 | 7/2011 | Govoreanu et al. |
| 2012/0012919 A1 | 1/2012 | Kan et al. |

US 10,319,728 B2

FLUID EJECTION DEVICES COMPRISING MEMORY CELLS

CROSS REFERENCE TO RELATED APPLICATIONS

This is a continuation of U.S. application Ser. No. 14/397,571, filed Oct. 28, 2014, U.S. Pat. No. 9,559,106, which is a national stage application under 35 U.S.C. § 371 of PCT/US2012/062755, filed Oct. 31, 2012, which are both hereby incorporated by reference in their entirety.

BACKGROUND

Fluid ejection devices are used to eject fluids. Inkjet printing systems are one type of fluid ejection device. Often, an inkjet printing system includes an inkjet printhead die that includes a semiconductor substrate having one or more arrays of firing nozzles and circuitry for addressing the nozzles. In some fluid ejection devices, such as in inkjet printhead systems, the semiconductor die or chip includes non-volatile memory, such as fuses.

In recent years, electronically programmable read-only memory (EPROM) devices have been developed. These devices include a memory cell at each row and column intersection. Each memory cell includes a floating gate and a control gate or input gate. In an un-programmed memory cell, the floating gate has no charge, which causes the threshold voltage to be low. In a programmed memory cell, the floating gate is charged with electrons and the threshold voltage is higher. A memory cell having a lower threshold voltage is one logic value and a memory cell having a higher threshold voltage is the other logic value.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that features of the various embodiments described herein may be combined with each other, unless specifically noted otherwise.

In fluid ejection devices, such as inkjet printing systems, EPROM cells can be used to eliminate fuses, such as in N channel metal oxide semiconductor (NMOS) circuits in inkjet printhead dice. EPROM cells do not include fuses and provide a number of advantages over fuses, including reduced die area per bit and improved reliability.

Manufacturing a semiconductor die including EPROM cells in an NMOS process reduces the cost of the semiconductor die in comparison to manufacturing the EPROM cell in a P channel metal oxide semiconductor (PMOS) process and in comparison to manufacturing the EPROM cell in a complementary metal oxide semiconductor (CMOS) process. Manufacturers continue improving EPROM cells, with improvements in reducing the cost of the semiconductor die, increasing the packing density of the EPROM cells, and improving adhesion to polymers that cover the semiconductor die.

Figure 1:
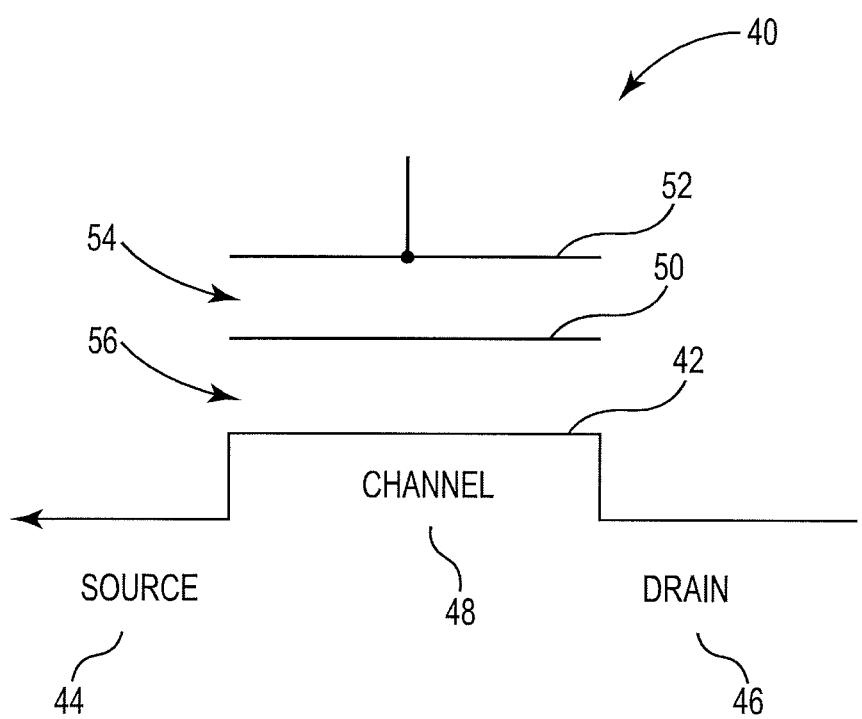
FIG. 1 is a diagram illustrating one example of an EPROM cell manufactured in a MOS process.

FIG. 1 is a diagram illustrating one example of an EPROM cell 40 manufactured in a MOS process. EPROM cells, such as EPROM cell 40, can be used in systems, such as inkjet printing systems. In one example, EPROM cell 40 is manufactured in an NMOS process. In one example, EPROM cell 40 is manufactured in a PMOS process. In one example, EPROM cell 40 is manufactured in a CMOS process.

EPROM cell 40 includes a semiconductor substrate 42 having a source 44, a drain 46, and a channel 48, where channel 48 is situated between source 44 and drain 46. A floating gate 50 is situated over channel 48 and an input gate 52, also referred to as a control gate 52, is situated over floating gate 50. In one example, source 44 includes an N+ doped region, drain 46 includes an N+ doped region, and channel 48 is a p doped region situated between the N+ doped regions of source 44 and drain 46.

Control gate 52 is capacitively coupled to floating gate 50 via a control gate capacitance, also referred to as a control capacitance, that includes dielectric material 54 situated between control gate 52 and floating gate 50. A voltage at control gate 52 is coupled to floating gate 50 via the control capacitance. Another layer of dielectric material 56 is disposed between floating gate 50 and substrate 42 over channel 48.

In one example EPROM cell 40 is manufactured in an NMOS process and to program EPROM cell 40, a high voltage bias is applied to drain 46. This high voltage bias on drain 46 generates energetic "hot" carriers or electrons. A positive voltage bias between control gate 52 and drain 46 pulls some of these hot electrons onto floating gate 50. As electrons are pulled onto floating gate 50, the threshold voltage of EPROM cell 40, i.e., the voltage required to cause channel 48 to conduct current, increases. If enough electrons are pulled onto floating gate 50, the threshold voltage increases to a level above a specified threshold voltage and EPROM cell 40 substantially blocks current at the specified threshold voltage level, which changes the logic state of EPROM cell 40 from one logic value to the other logic value. Thus, EPROM cell 40 is programmed via hot carrier injection onto floating gate 50. In normal operation, a sensor (not shown) is used to detect the state of EPROM cell 40.

Figure 2:
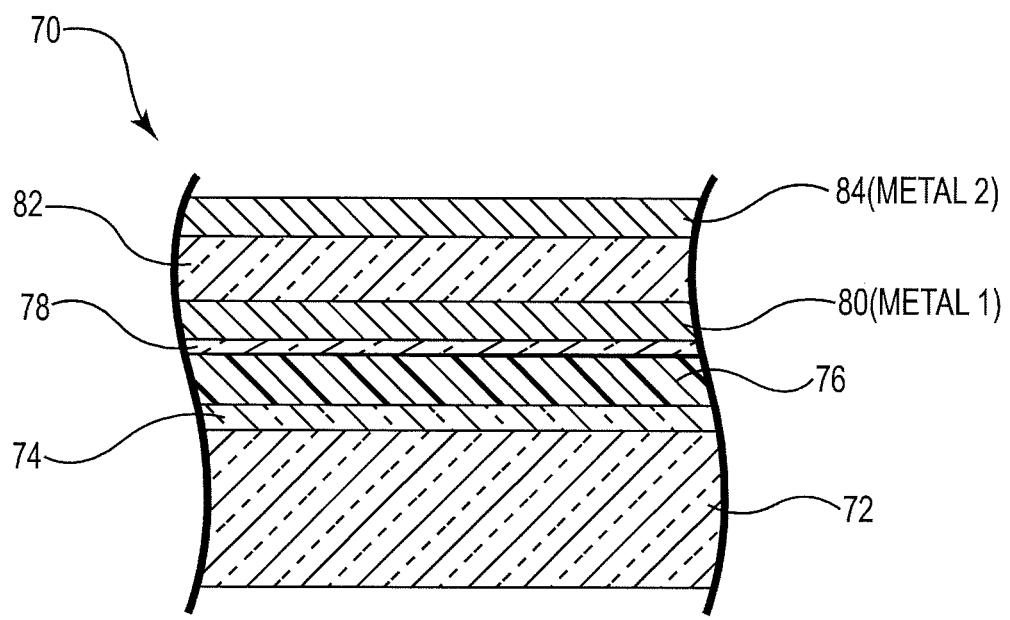
FIG. 2 is a diagram illustrating one example of material layers in a semiconductor die that was manufactured in an NMOS process.

FIG. 2 is a diagram illustrating one example of material layers in a semiconductor die 70 manufactured in an NMOS process. In one example, semiconductor die 70 includes EPROM cells, such as EPROM cell 40 of FIG. 1. In one example, semiconductor die 70 is used in an inkjet printhead. In one example, semiconductor die 70 is an inkjet control chip including EPROM cells. In one example, semiconductor die 70 is an inkjet printhead die including EPROM cells.

Semiconductor die 70 includes a semiconductor substrate 72, a gate dielectric layer 74, a polysilicon layer 76, a floating gate dielectric layer 78, a metal 1 layer 80, a control gate dielectric layer 82, and a metal 2 layer 84. Gate dielectric layer 74 is disposed on substrate 72 between substrate 72 and polysilicon layer 76. Floating gate dielectric layer 78 is disposed over polysilicon layer 76 and between polysilicon layer 76 and metal 1 layer 80. Control gate dielectric layer 82 is disposed over metal 1 layer 80 and between metal 1 layer 80 and metal 2 layer 84. Metal 1 layer 80 and metal 2 layer 84 provide addressing lines, such as row lines and column lines, and other connections in semiconductor die 70.

Figure 3:
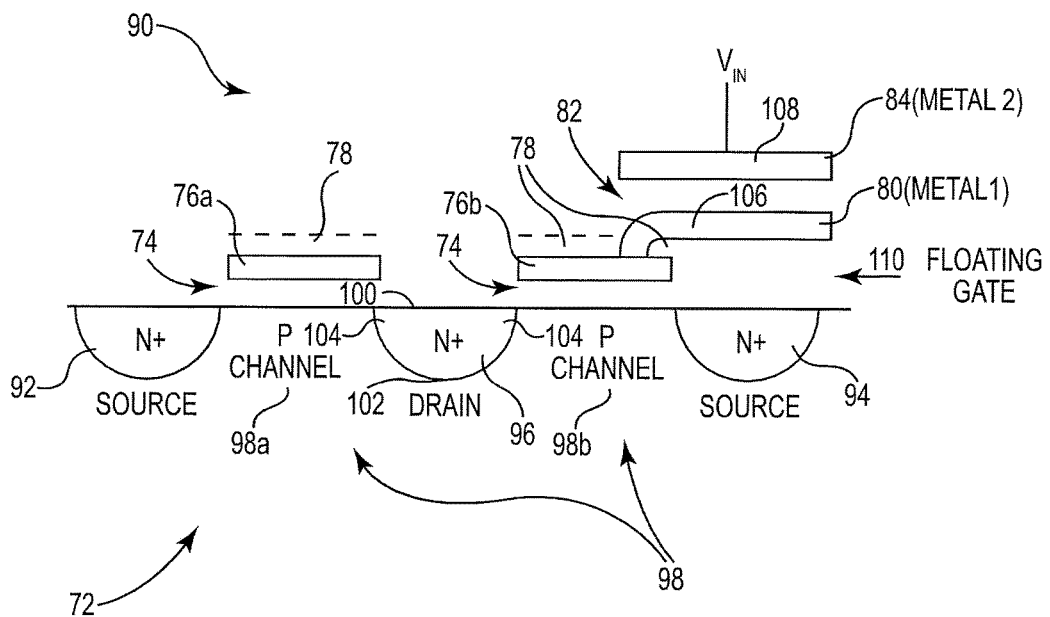
FIG. 3 is a diagram illustrating one example of an EPROM cell that uses the layers of the semiconductor die of FIG. 2.

FIG. 3 is a diagram illustrating one example of an EPROM cell 90 that uses the layers of semiconductor die 70 of FIG. 2. In one example, EPROM cell 40 of FIG. 1 is similar to EPROM cell 90. In one example, EPROM cell 90 is used in an inkjet printing system. In one example, EPROM cell 90 is used in an inkjet control chip. In one example, EPROM cell 90 is used in an inkjet printhead die.

EPROM cell 90 includes substrate 72 that has N+ source regions 92 and 94, an N+ drain region 96, and a p channel 98 that includes p channel regions 98a and 98b. Drain region 96 includes a top surface 100, a bottom 102, and sides 104 between top surface 100 and bottom 102. Channel 98, including channel regions 98a and 98b, surrounds drain region 96 around the sides 104 of drain region 96. Channel 98 is situated between source region 92 and drain region 96 and between source region 94 and drain region 96. In one example, source regions 92 and 94 are connected and part of one continuous source region that surrounds channel 98.

Channel 98 includes a closed curve structure around drain region 96, where a curve is defined as an object similar to a line, but not required to be straight, which entails that a line is a special case of a curve, namely a curve with null curvature. Also, a closed curve is defined as a curve that joins up and has no endpoints.

EPROM cell 90 includes capacitive coupling between metal 1 layer 80 and metal 2 layer 84, where metal 1 layer 80 and metal 2 layer 84 form parallel opposing capacitor plates 106 and 108. One capacitor plate 106 is formed in metal 1 layer 80 and the other capacitor plate 108 is formed in metal 2 layer 84. Capacitor plate 108 is the control gate 108 of EPROM cell 90. An input voltage Vin is applied to control gate 108 and capacitively coupled to capacitor plate 106. In one example, control gate 108 is similar to control gate 52 (shown in FIG. 1).

Floating gate 110 includes polysilicon layer 76 connected to metal 1 layer 80. Floating gate 110 includes polysilicon floating gate regions 76a and 76b situated over and parallel to channel regions 98a and 98b, respectively. A break or hole in floating gate dielectric layer 78 allows capacitor plate 106 in metal 1 layer 80 to be electrically coupled to polysilicon floating gate regions 76a and 76b. Floating gate 110 is separated from substrate 72 by gate dielectric layer 74.

To program EPROM cell 90, a high input voltage pulse is applied to control gate 108 and drain region 96, across drain region 96 to source regions 92 and 94. This generates energetic "hot" carriers or electrons. A positive voltage bias between control gate 108 and drain region 96 pulls some of these hot electrons onto floating gate 110. As electrons are pulled onto floating gate 110, the threshold voltage of EPROM cell 90, i.e., the voltage required to cause channel 98 to conduct current, increases. If enough electrons are pulled onto floating gate 110, the threshold voltage increases to a level above a specified threshold voltage and EPROM cell 90 substantially blocks current at a specified threshold voltage level, which changes the logic state of EPROM cell 90 from one logic value to the other logic value. Thus, EPROM cell 90 is programmed via hot carrier injection onto floating gate 110.

To read or sense the state of EPROM cell 90, the threshold voltage is detected and/or the on resistance is measured using a sensor (not shown). Reading or sensing the state of EPROM cell 90 can be done by setting the gate/drain voltage and measuring the corresponding current or by setting the current and measuring the voltage. The measured on resistance of EPROM cell 90 changes by a factor of about 2 from an un-programmed state to a programmed state.

Figure 4:
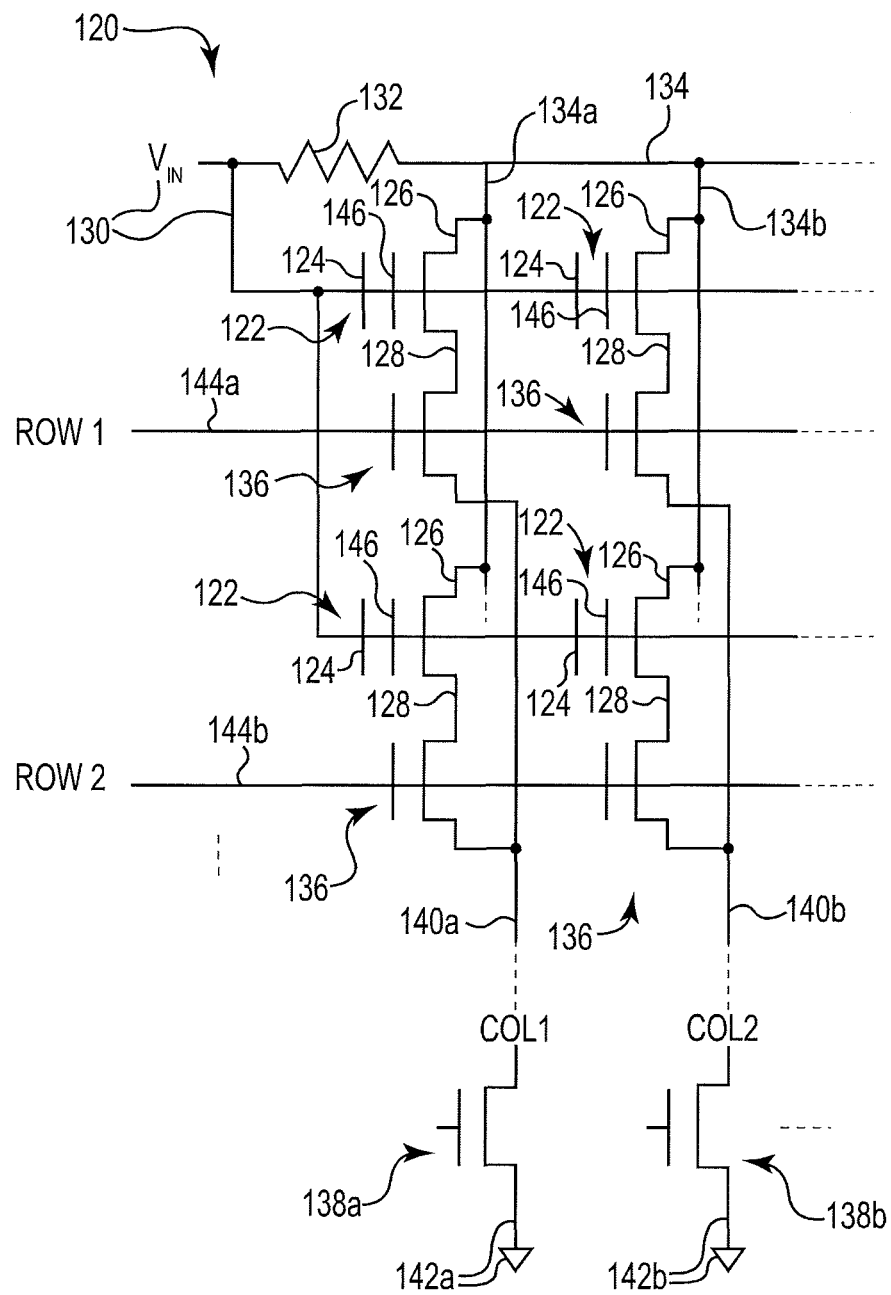
FIG. 4 is a diagram illustrating one example of an EPROM array.

FIG. 4 is a diagram illustrating one example of an EPROM array 120 including EPROM cells 122 arranged in rows and columns. In one example, each of the EPROM cells 122 is similar to EPROM cell 40 of FIG. 1.

Each of the EPROM cells 122 includes a control gate 124, a drain 126, and a source 128. Control gates 124 are electrically coupled to input voltage Vin at 130. Drains 126 are electrically coupled together and to series resistor 132 via drain line 134, including drain lines 134a and 134b. The other side of series resistor 132 is electrically coupled to input voltage Vin at 130. Sources 128 are electrically coupled to the drains of row transistors 136, and the sources of row transistors 136 are electrically coupled to the drains of column transistors 138a and 138b via column lines 140a and 140b. The sources of column transistors 138a and 138b are electrically coupled to references at 142a and 142b, such as ground. Row transistors 136 and column transistors 138a and 138b provide selection of EPROM cells 122 for programming and reading.

Row lines 144a and 144b are electrically coupled to the gates of row transistors 136. Row line 144a provides row signal ROW1 at 144a to the gates of row transistors 136 in one row and row line 144b provides row signal ROW2 at 144b to the gates of row transistors 136 in another row. The sources of row transistors 136 in a given column are electrically coupled together and to the drain of one of the column transistors 138a and 138b that corresponds to the given column. The gate of each column transistor 138a and 138b is electrically coupled to a column select signal via a column select line (not shown).

Each of the EPROM cells 122 is programmed by providing a voltage pulse in input voltage Vin at 130. The voltage pulse is provided to control gate 124, and to drain 126 through resistor 132. The voltage pulse is provided across the drain 126 and source 128 of a selected EPROM cell 122. This provides hot carriers or electrons to floating gate 146. The time required for programming is a function of at least the floating gate voltage, the quantity of hot electrons drawn to the floating gate, the threshold voltage needed, and the thickness of the gate dielectric layer between the substrate and the floating gate. For each of the EPROM cells 122, control gate 124 is coupled to drain 126 through resistor 132 to limit the breakdown current. In one example, resistor 132 has a resistance of 100 ohms.

In one example, the programming voltage across drain 126 to source 128 is close to the breakdown voltage of EPROM cell 122, where the breakdown voltage is the voltage at which EPROM cell 122 begins to conduct with its control gate 124 below the threshold voltage, such as zero volts. In one example, an EPROM cell 122 is programmed at a voltage of about 16V, where the circuit has a breakdown voltage of 15V. In one example, the floating gate voltage is in the range of 5V to 12V. In one example, the threshold voltage is in the range of 3V to 7V.

To read one of the EPROM cells 122, the threshold voltage is detected using a sensor (not shown). Detecting the threshold voltage can be done by setting the gate and drain voltages and measuring the corresponding current or by setting the current and measuring one or more of the gate and drain voltages. The on resistance Ron of an EPROM cell 122 changes by a factor of about 2 from being unprogrammed to being programmed.

To program one of the EPROM cells 122, the EPROM cell 122 is selected by providing a row select voltage to one of the row lines 144a and 144b and a column select voltage to the gate of one of the column transistors 138a and 138b. Next, a relatively high input voltage Vin, such as 16V, is provided at 130. Only the selected EPROM cell 122 has substantially the full input voltage Vin across the drain 126 to the source 128. All other EPROM cells 122 have source 128 floating to voltages on the other terminals.

To sense the state of a selected EPROM cell 122, a current, such as a 1 milli-ampere current, is provided through the selected EPROM cell 122 and the voltage Vin at 130 is monitored. In another example, to sense the state of a selected EPROM cell 122, a relatively low input voltage pulse Vin, such as 5V, is provided at 130 and the current through the selected EPROM cell 122 is monitored. In other examples, each EPROM cell 122 has a different control transistor coupled to it, where each EPROM cell 122 is selected via one control line coupled to the corresponding control transistor.

Figure 5:
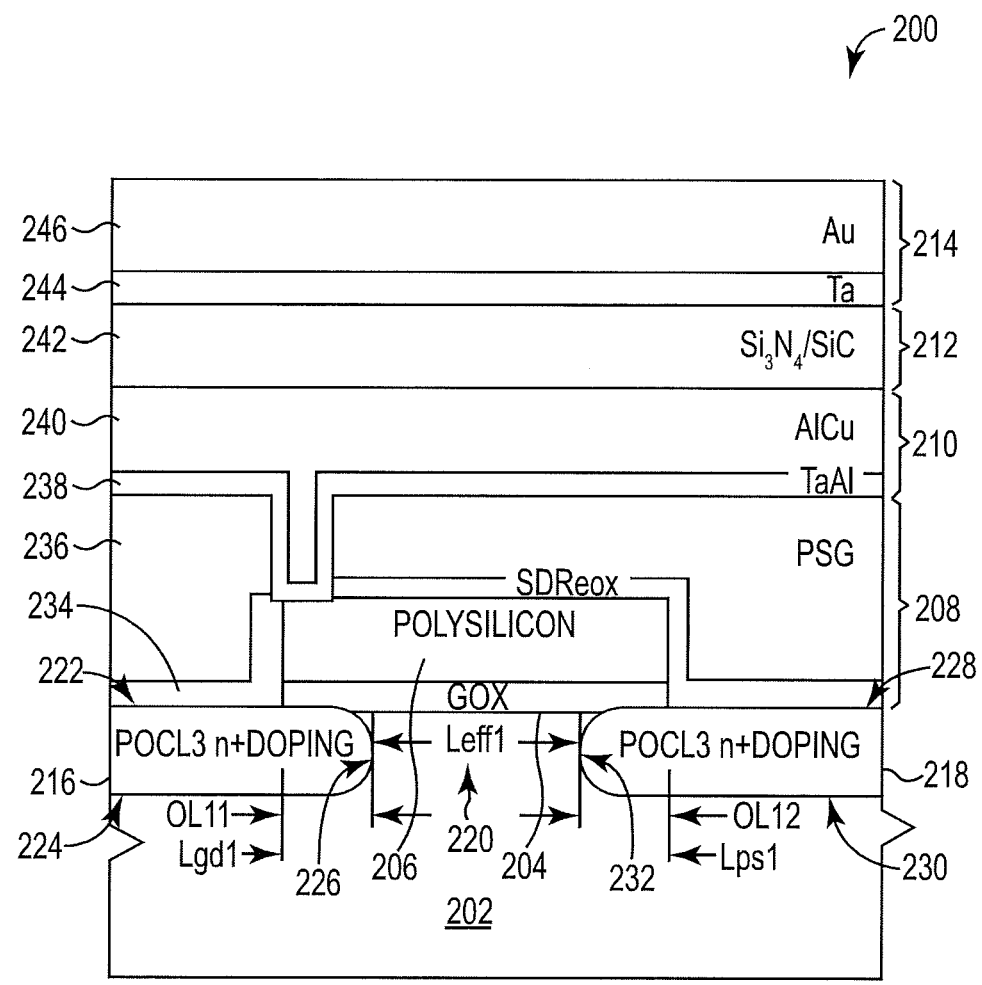
FIG. 5 is a diagram illustrating one example of an EPROM cell manufactured in an NMOS process.

FIG. 5 is a diagram illustrating one example of an EPROM cell 200 manufactured in an NMOS process. In another example, an EPROM cell similar to EPROM cell 200 is manufactured in a PMOS process. In another example, an EPROM cell similar to EPROM cell 200 is manufactured in a CMOS process.

In one example, EPROM cell 200 is similar to EPROM cell 40 of FIG. 1. In one example, EPROM cell 200 is included in an inkjet printhead. In one example, EPROM cell 200 is included in an inkjet control chip. In one example, EPROM cell 200 is included in an inkjet printhead die.

EPROM cell 200 includes a semiconductor substrate 202, a gate dielectric layer 204, a polysilicon layer 206, a floating gate dielectric layer 208, a metal 1 layer 210, a control gate dielectric layer 212, and a metal 2 layer 214. In one example, EPROM cell 200 includes a polymer layer (not shown) on metal 2 layer 214.

Semiconductor substrate 202 includes an N+ source region 216, an N+ drain region 218, and a p channel region 220 situated between source region 216 and drain region 218. Source region 216 includes a top surface 222, a bottom 224, and sides 226 between top surface 222 and bottom 224. Drain region 218 includes a top surface 228, a bottom 230, and sides 232 between top surface 228 and bottom 230. Channel region 220 is situated between sides 226 of source region 216 and sides 232 of drain region 218. In one example, channel region 220 surrounds drain region 218 around sides 232 of drain region 218. In one example, sides 226 of source region 216 surround channel region 220. In one example, channel region 220 includes a closed curve structure around drain region 218, where a curve is defined as an object similar to a line, but not required to be straight, which entails that a line is a special case of a curve, namely a curve with null curvature. Also, a closed curve is defined as a curve that joins up and has no endpoints.

Each of the source region 216 and the drain region 218 is manufactured in a diffusion process using phosphoryl chloride, also referred to as phosphorus oxychloride, (POCL3). POCL3 is a safe liquid phosphorus source used in diffusion processes, where the phosphorus acts as an N+ doping agent for creating N+ source region 216 and N+ drain region 218. Channel region 220, which is situated between source region 216 and drain region 218, has an effective channel length Leff1. In one example, Leff1 is 1-1.2 micrometers.

Gate dielectric layer 204 is disposed on substrate 202 between substrate 202 and polysilicon layer 206. Gate dielectric layer 204 overlaps source region 216 at OL11 and gate dielectric layer 204 overlaps drain region 218 at OL12. In one example, gate dielectric layer 204 is a gate oxide layer. In one example, gate dielectric layer 204 is silicon dioxide (SiO2). In one example, OL11 is 1 micrometer and OL12 is 1 micrometer. In one example, the length Lgd1 of gate dielectric layer 204 is in a range from 3 micrometers to 3.2 micrometers.

Polysilicon layer 206 is situated on gate dielectric layer 204. In one example, the length Lps1 of polysilicon layer 206 is the same as the length Lgd1 of gate dielectric layer 204.

Floating gate dielectric layer 208 is disposed over polysilicon layer 206 and between polysilicon layer 206 and metal 1 layer 210. Floating gate dielectric layer 208 includes a source drain re-oxidation (SDReox) layer 234 and a phosphor silicon glass (PSG) layer 236. SDReox layer 234 is disposed over polysilicon layer 206, gate dielectric layer 204, and semiconductor substrate 202 in a low pressure chemical vapor deposition process. PSG layer 236 is disposed on SDReox layer 234 at about 1000 degrees centigrade.

Metal 1 layer 210 is disposed on floating gate dielectric layer 208. Metal 1 layer 210 includes a tantalum aluminum (TaAl) layer 238 on PSG layer 236 and an aluminum copper (AlCu) layer 240 on TaAl layer 238.

The floating gate of EPROM cell 200 includes polysilicon layer 206 connected to metal 1 layer 210. A break or hole in floating gate dielectric layer 208, including a break or hole in SDReox layer 234 and PSG layer 236, allows metal 1 layer 210, including TaAl layer 238 and AlCu layer 240, to be electrically coupled to polysilicon layer 206. The floating gate is separated from substrate 202 by gate dielectric layer 204.

Control gate dielectric layer 212 is disposed on metal 1 layer 210 and between metal 1 layer 210 and metal 2 layer 214. Control gate dielectric layer 212 is a tri-silicon tetranitride (Si3N4) and silicon carbide (SiC) layer 242. In one example, Si3N4 and SiC layer 242 has a dielectric constant of about 6.8.

Metal 2 layer 214 is disposed on control gate dielectric 212. Metal 2 layer 214 includes a tantalum (Ta) layer 244 on Si3N4 and SiC layer 242, and a gold (Au) layer 246 on Ta layer 244. In packaging, a polymer layer (not shown) is disposed on Au layer 246. Metal 1 layer 210 and metal 2 layer 214 provide addressing lines, such as row lines and column lines, and other connections in EPROM cell 200.

EPROM cell 200 includes capacitive coupling between metal 1 layer 210 and metal 2 layer 214, where metal 1 layer 210 and metal 2 layer 214 form parallel opposing capacitor plates. One capacitor plate is formed in metal 1 layer 210 and the other capacitor plate is formed in metal 2 layer 214. The capacitor plate formed in metal 2 layer 214 is the control gate of EPROM cell 200 and the capacitor plate formed in metal 1 layer 210 is part of the floating gate of EPROM cell 200. An input voltage Vin is applied to the capacitor plate formed in metal 2 layer 214, i.e., the control gate of EPROM cell 200, and capacitively coupled to the capacitor plate formed in metal 1 layer 210, i.e., the floating gate of EPROM cell 200. In one example, the control gate of EPROM cell 200 is similar to control gate 52 (shown in FIG. 1) and the floating gate of EPROM cell 200 is similar to floating gate 50 (shown in FIG. 1).

To program EPROM cell 200, a high input voltage pulse is applied to the control gate of EPROM cell 200 and to drain region 218, across drain region 218 to source region 216. This generates energetic "hot" carriers or electrons. A positive voltage bias between the control gate of EPROM cell 200 and drain region 218 pulls some of these hot electrons onto the floating gate of EPROM cell 200. As electrons are pulled onto the floating gate of EPROM cell 200, the threshold voltage of EPROM cell 200, i.e., the voltage required to cause channel region 220 to conduct current, increases. If enough electrons are pulled onto the floating gate of EPROM cell 200, the threshold voltage increases to a level above a specified threshold voltage and EPROM cell 200 substantially blocks current at the specified threshold voltage level, which changes the logic state of EPROM cell 200 from one logic value to the other logic value. Thus, EPROM cell 200 is programmed via hot carrier injection onto the floating gate of EPROM cell 200.

To read or sense the state of EPROM cell 200, the threshold voltage is detected and/or the on resistance is measured using a sensor (not shown). Reading or sensing the state of EPROM cell 200 can be done by setting the control gate voltage and the drain voltage of EPROM cell 200 and measuring the corresponding current or by setting the current and measuring the control gate and/or drain voltages. The measured on resistance of EPROM cell 200 changes by a factor of about 2 from an un-programmed state to a programmed state.

Figure 6:
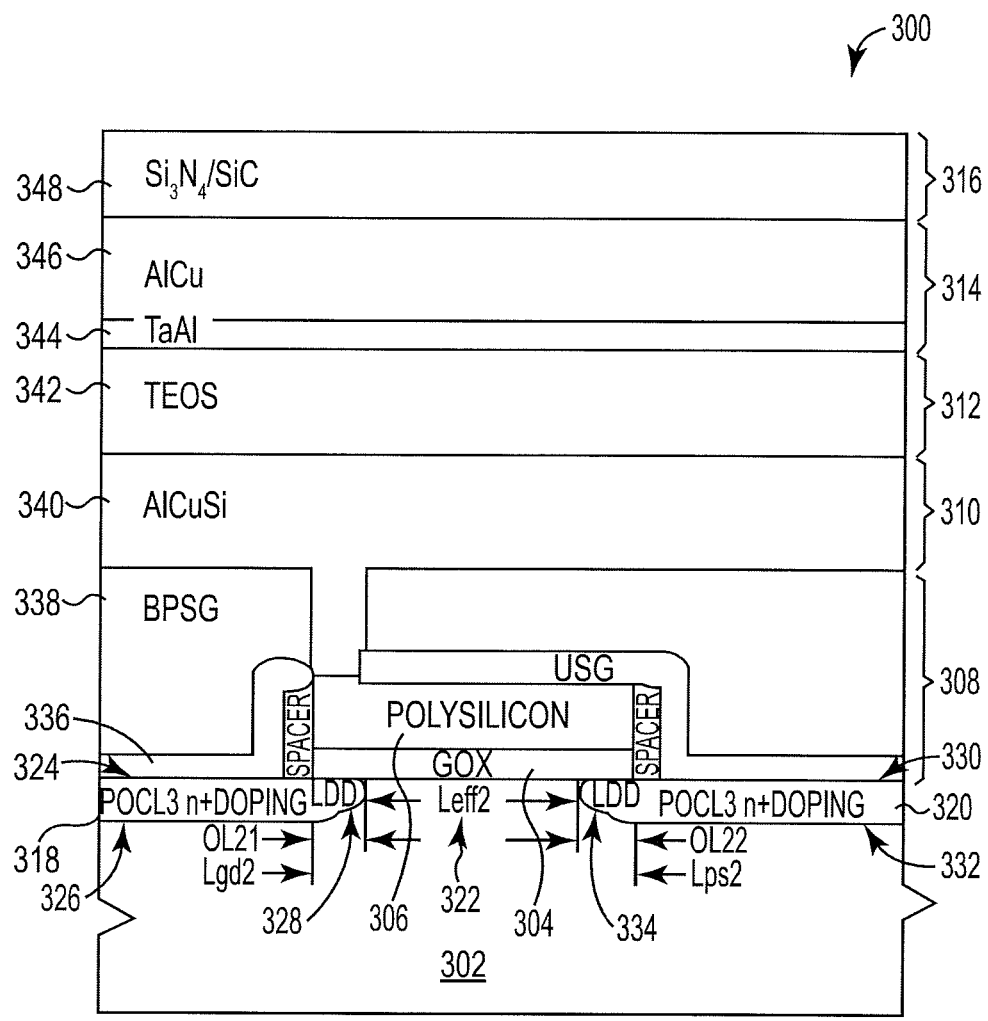
FIG. 6 is a diagram illustrating one example of a cost-reduced EPROM cell manufactured in an NMOS process.

FIG. 6 is a diagram illustrating one example of a cost-reduced EPROM cell 300 manufactured in an NMOS process. In another example, an EPROM cell similar to EPROM cell 300 is manufactured in a PMOS process. In another example, an EPROM cell similar to EPROM cell 300 is manufactured in a CMOS process.

In one example, EPROM cell 300 is similar to EPROM cell 40 of FIG. 1. In one example, EPROM cell 300 is included in an inkjet printhead. In one example, EPROM cell 300 is included in an inkjet control chip. In one example, EPROM cell 300 is included in an inkjet printhead die.

EPROM cell 300 includes a semiconductor substrate 302, a gate dielectric layer 304, a polysilicon layer 306, a floating gate dielectric layer 308, a metal 1 layer 310, a control gate dielectric layer 312, a metal 2 layer 314, and a top dielectric layer 316. In one example, EPROM cell 300 includes a polymer layer (not shown) on top dielectric layer 316.

Semiconductor substrate 302 includes an N+ source region 318, an N+ drain region 320, and a p channel region 322 situated between source region 318 and drain region 320. Source region 318 includes a top surface 324, a bottom 326, and sides 328 between top surface 324 and bottom 326. Drain region 320 includes a top surface 330, a bottom 332, and sides 334 between top surface 330 and bottom 332. Channel region 322 is situated between sides 328 of source region 318 and sides 334 of drain region 320. In one example, channel region 322 surrounds drain region 320 around sides 334 of drain region 320. In one example, sides 328 of source region 318 surround channel region 322. In one example, channel region 322 includes a closed curve structure around drain region 320, where a curve is defined as an object similar to a line, but not required to be straight, which entails that a line is a special case of a curve, namely a curve with null curvature. Also, a closed curve is defined as a curve that joins up and has no endpoints.

Each of the source region 318 and the drain region 320 is manufactured in a low doped drain (LDD) process. POCL3 provides an N+ doping agent for creating N+ source region 318 and N+ drain region 320. The LDD process provides a source region 318 that is not diffused or implanted as deeply in semiconductor substrate 302 as source region 216 is diffused or implanted in semiconductor substrate 202 (shown in FIG. 5). Also, the LDD process provides a drain region 320 that is not diffused or implanted as deeply in semiconductor substrate 302 as drain region 218 is diffused or implanted in semiconductor substrate 202 (shown in FIG. 5).

Channel region 322, which is situated between source region 318 and drain region 320, has an effective channel length Leff2. In one example, the effective channel length Leff2 of EPROM cell 300 is the same as the effective channel length Leff1 of EPROM cell 200 of FIG. 5. In one example, Leff2 is 1-1.2 micrometers.

Gate dielectric layer 304 is disposed on substrate 302 between substrate 302 and polysilicon layer 306. Gate dielectric layer 304 overlaps source region 318 at OL21 and gate dielectric layer 304 overlaps drain region 320 at OL22. The effective channel length Leff2 of EPROM cell 300 is two or more times longer than the overlap of source region 318 at OL21. Also, the effective channel length Leff2 of EPROM cell 300 is two or more times longer than the overlap of drain region 320 at OL22. In one example, gate dielectric layer 304 is a gate oxide layer. In one example, gate dielectric layer 304 is SiO2. In one example, OL21 is 0.4 micrometers and OL22 is 0.4 micrometers. In one example, the length Lgd2 of gate dielectric layer 304 is in a range from 1.8 micrometers to 2.0 micrometers.

EPROM cell 300 is smaller than EPROM cell 200 of FIG. 5 and EPROM cell 300 takes up less area on a semiconductor die than EPROM cell 200. The length Lgd2 of gate dielectric layer 304 is less than the length Lgd1 of gate dielectric layer 204 (shown in FIG. 5). This is due to the overlap of source region 318 at OL21 being less than half the overlap of source region 216 at OL11 (shown in FIG. 5) and the overlap of drain region 320 at OL22 being less than half the overlap of drain region 218 at OL12. Using EPROM cell 300 instead of EPROM cell 200 increases the packing density of EPROM cells on a semiconductor die and reduces the cost per bit of EPROM on the semiconductor die. In one example, the effective channel length Leff2 of EPROM cell 300 is the same or about the same as the effective channel length Leff1 of EPROM cell 200 of FIG. 2, and the overlap of source region 318 at OL21 is less than half the overlap of source region 216 at OL11 (shown in FIG. 5) and the overlap of drain region 320 at OL22 is less than half the overlap of drain region 218 at OL12.

Polysilicon layer 306 is situated on gate dielectric layer 304. In one example, the length Lps2 of polysilicon layer 306 is the same as the length Lgd2 of gate dielectric layer 304.

Floating gate dielectric layer 308 is disposed over polysilicon layer 306 and between polysilicon layer 306 and metal 1 layer 310. Floating gate dielectric layer 308 includes an undoped silicon glass (USG) layer 336 and a boron phosphor silicon glass (BPSG) layer 338. USG layer 336 is disposed over polysilcon layer 306 and a spacer disposed along the sides of polysilicon layer 306 and gate dielectric layer 304 and over semiconductor substrate 302 in an atmospheric pressure chemical vapor deposition process. BPSG layer 338 is disposed on USG layer 336 at about 820 degrees centigrade. The atmospheric pressure chemical vapor deposition process of USG layer 336 is more cost effective than the low pressure chemical vapor deposition of SDReox layer 234, which reduces the cost of EPROM cell 300 as compared to EPROM cell 200 of FIG. 5. Disposing BPSG layer 338 at 820 degrees centigrade, instead of disposing PSG layer 236 at 1000 degrees centigrade, provides better control over the depth of N+ source region 318 and N+ drain region 320, better control over the effective channel length Leff2, and better control over overlapping of source region 318 and drain region 320 with gate dielectric layer 304, as compared to EPROM cell 200 of FIG. 5.

Metal 1 layer 310 is disposed on floating gate dielectric layer 308. Metal 1 layer 310 is an aluminum copper silicon (AlCuSi) layer 340 on BPSG layer 338. The TaAl layer 238 of metal 1 layer 210 (shown in FIG. 5) is not in EPROM cell 300, which reduces the cost of EPROM cell 300 as compared to EPROM cell 200 of FIG. 5.

The floating gate of EPROM cell 300 includes polysilicon layer 306 connected to metal 1 layer 310. A break or hole in floating gate dielectric layer 308, including a break or hole in USG layer 336 and BPSG layer 338, allows metal 1 layer 310, including AlCuSi layer 340, to be electrically coupled to polysilicon layer 306. The floating gate is separated from substrate 302 by gate dielectric layer 304.

Control gate dielectric layer 312 is disposed on metal 1 layer 310 and between metal 1 layer 310 and metal 2 layer 314. Control gate dielectric layer 312 is a tetraethyl orthosilicate (TEOS) layer 342. Disposing TEOS layer 342 on metal 1 layer 310 can be done at a lower temperature and is less expensive than disposing the Si3N4 and SiC layer 242 on metal 1 layer 210. This reduces the cost of EPROM cell 300 as compared to EPROM cell 200 of FIG. 5 and provides better control over the depth of N+ source region 318 and N+ drain region 320, better control over the effective channel length Leff2, and better control over overlapping of source region 318 with gate dielectric 304 and drain region 320 with gate dielectric layer 304, as compared to EPROM cell 200 of FIG. 5. In one example, TEOS layer 342 has a dielectric constant of about 4.2. In one example, TEOS layer 342 is 5000 angstroms thick Metal 2 layer 314 is disposed on control gate dielectric layer 312. Metal 2 layer 314 includes a TaAl layer 344 on TEOS layer 342 and an AlCu layer 346 on TaAl layer 344. Metal 2 layer 314 does not include a gold layer, such as Au layer 246, which reduces the cost of EPROM cell 300 as compared to EPROM cell 200 of FIG. 5. Metal 1 layer 310 and metal 2 layer 314 provide addressing lines, such as row lines and column lines, and other connections in EPROM cell 300.

Top dielectric layer 316 is disposed on metal 2 layer 314. Top dielectric layer 316 is a Si3N4 and SiC layer 348. In packaging, a polymer layer (not shown) is disposed on top dielectric layer 316. Top dielectric layer 316 provides better adhesion to the polymer layer than Au layer 246 (shown in FIG. 5), which improves reliability of EPROM cell 300 over EPROM cell 200 and opens up the use of more corrosive fluids, such as more corrosive inks, in a fluid ejection system. Also, top dielectric layer 316 protects EPROM cell 300 from degradation, such as oxidation, particle contamination, and other environmental degradation. In one example, Si3N4 and SiC layer 348 has a dielectric constant of about 6.8.

EPROM cell 300 includes capacitive coupling between metal 1 layer 310 and metal 2 layer 314, where metal 1 layer 310 and metal 2 layer 314 form parallel opposing capacitor plates. One capacitor plate is formed in metal 1 layer 310 and the other capacitor plate is formed in metal 2 layer 314. The capacitor plate formed in metal 2 layer 314 is the control gate of EPROM cell 300 and the capacitor plate formed in metal 1 layer 310 is part of the floating gate of EPROM cell 300. An input voltage Vin is applied to the capacitor plate formed in metal 2 layer 314, i.e., the control gate of EPROM cell 300, and capacitively coupled to the capacitor plate formed in metal 1 layer 310, i.e., the floating gate of EPROM cell 300. In one example, the control gate of EPROM cell 300 is similar to control gate 52 (shown in FIG. 1) and the floating gate of EPROM cell 300 is similar to floating gate 50 (shown in FIG. 1).

To program EPROM cell 300, a high input voltage pulse is applied to the control gate of EPROM cell 300 and to drain region 320, across drain region 320 to source region 318. This generates energetic "hot" carriers or electrons. A positive voltage bias between the control gate of EPROM cell 300 and drain region 320 pulls some of these hot electrons onto the floating gate of EPROM cell 300. As electrons are pulled onto the floating gate of EPROM cell 300, the threshold voltage of EPROM cell 300, i.e., the voltage required to cause channel region 322 to conduct current, increases. If enough electrons are pulled onto the floating gate of EPROM cell 300, the threshold voltage increases to a level above a specified threshold voltage and EPROM cell 300 substantially blocks current at the specified threshold voltage level, which changes the logic state of EPROM cell 300 from one logic value to the other logic value. Thus, EPROM cell 300 is programmed via hot carrier injection onto the floating gate of EPROM cell 300.

To read or sense the state of EPROM cell 300, the threshold voltage is detected and/or the on resistance is measured using a sensor (not shown). Reading or sensing the state of EPROM cell 300 can be done by setting the control gate voltage and the drain voltage of EPROM cell 300 and measuring the corresponding current or by setting the current and measuring the control gate and/or drain voltages. The measured on resistance of EPROM cell 300 changes by a factor of about 2 from an un-programmed state to a programmed state.

EPROM cell 300 is programmed via hot carrier injection onto the floating gate of EPROM cell 300. Loss of hot carriers or charges injected onto the floating gate can change the state of EPROM cell 300. It has been found that a primary leakage path of charges from the floating gate is the interface of metal 1 layer 310 and control gate dielectric layer 312, which is TEOS layer 342. One mechanism of charge loss includes TEOS layer 342 absorbing moisture and releasing H+ mobile ions. These H+ mobile ions diffuse through TEOS layer 342 and onto metal 1 layer 310, where the hot carriers or electrons on the floating gate are annihilated by the H+ mobile ions. This results in charge loss from the floating gate and a data retention issue.

Figure 7:
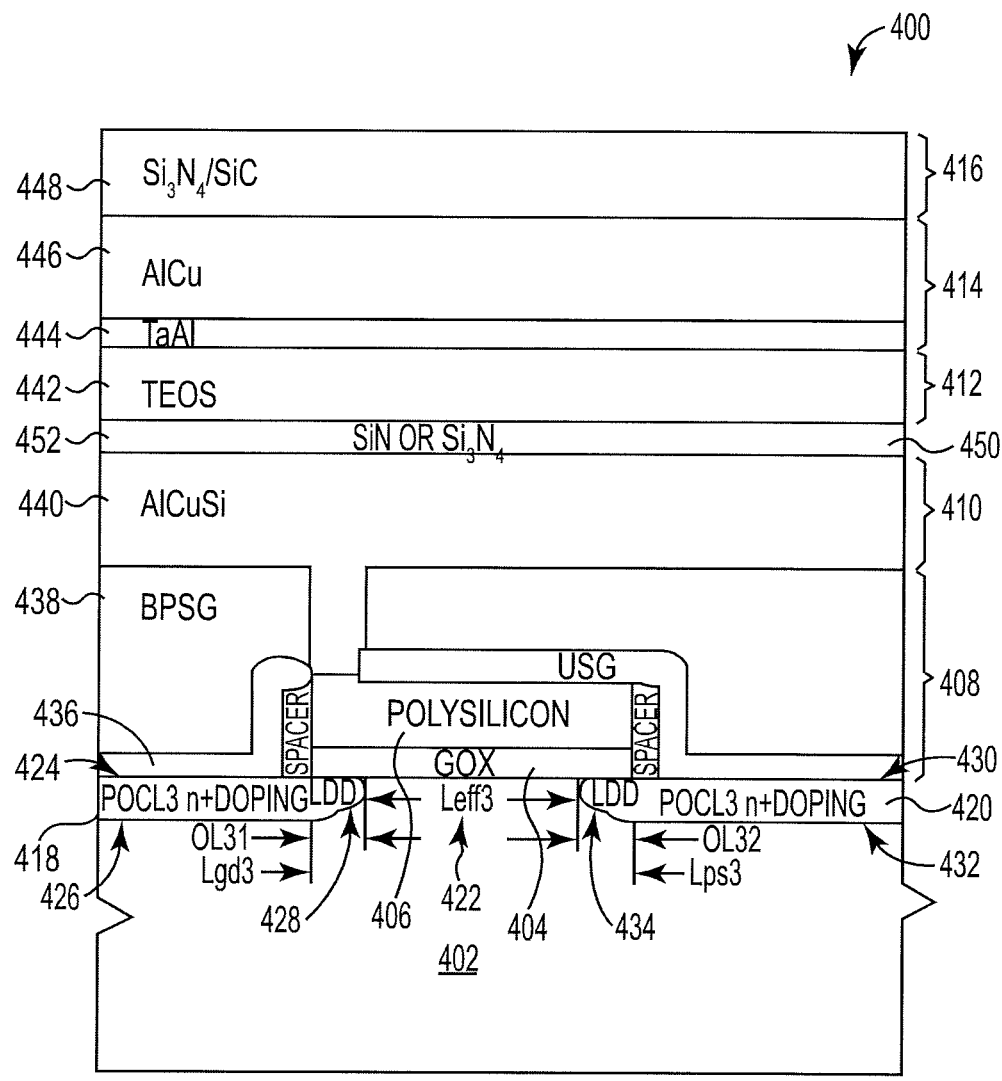
FIG. 7 is a diagram illustrating one example of a cost-reduced EPROM cell that includes a floating gate charge retention layer.

FIG. 7 is a diagram illustrating one example of a cost-reduced EPROM cell 400 that includes a floating gate charge retention layer 450. EPROM cell 400 is similar to EPROM cell 300 of FIG. 6 except for charge retention layer 450. In another example, an EPROM cell similar to EPROM cell 400 is manufactured in a PMOS process. In another example, an EPROM cell similar to EPROM cell 400 is manufactured in a CMOS process.

In one example, EPROM cell 400 is similar to EPROM cell 40 of FIG. 1. In one example, EPROM cell 400 is included in an inkjet printhead. In one example, EPROM cell 400 is included in an inkjet control chip. In one example, EPROM cell 400 is included in an inkjet printhead die.

EPROM cell 400 includes a semiconductor substrate 402, a gate dielectric layer 404, a polysilicon layer 406, a floating gate dielectric layer 408, a metal 1 layer 410, charge retention layer 450, a control gate dielectric layer 412, a metal 2 layer 414, and a top dielectric layer 416. In one example, EPROM cell 400 includes a polymer layer (not shown) on top dielectric layer 416.

Semiconductor substrate 402 includes an N+ source region 418, an N+ drain region 420, and a p channel region 422 situated between source region 418 and drain region 420. Source region 418 includes a top surface 424, a bottom 426, and sides 428 between top surface 424 and bottom 426. Drain region 420 includes a top surface 430, a bottom 432, and sides 434 between top surface 430 and bottom 432. Channel region 422 is situated between sides 428 of source region 418 and sides 434 of drain region 420 and has an effective channel length Leff3. In one example, the effective channel length Leff3 of EPROM cell 400 is the same as the effective channel length Leff1 of EPROM cell 200 of FIG. 5. In one example, Leff3 is 1-1.2 micrometers.

Gate dielectric layer 404 is disposed on substrate 402 between substrate 402 and polysilicon layer 406. Gate dielectric layer 404 overlaps source region 418 at OL31 and gate dielectric layer 404 overlaps drain region 420 at OL32. The effective channel length Leff3 of EPROM cell 400 is two or more times longer than the overlap of source region 418 at OL31, and the effective channel length Leff3 of EPROM cell 400 is two or more times longer than the overlap of drain region 420 at OL32. In one example, OL31 is 0.4 micrometers and OL32 is 0.4 micrometers. In one example, the length Lgd3 of gate dielectric layer 404 is in a range from 1.8 micrometers to 2.0 micrometers.

EPROM cell 400 is smaller than EPROM cell 200 of FIG. 5 and EPROM cell 400 takes up less area on a semiconductor die than EPROM cell 200. The length Lgd3 of gate dielectric layer 404 is less than the length Lgd1 of gate dielectric layer 204 (shown in FIG. 5). This is due to the overlap of source region 418 at OL31 being less than half the overlap of source region 216 at OL11 (shown in FIG. 5) and the overlap of drain region 420 at OL32 being less than half the overlap of drain region 218 at OL12. Using EPROM cell 400 instead of EPROM cell 200 increases the packing density of EPROM cells on a semiconductor die and reduces the cost per bit of EPROM on the semiconductor die. In one example, the effective channel length Leff3 of EPROM cell 400 is the same or about the same as the effective channel length Leff1 of EPROM cell 200 of FIG. 2, and the overlap of source region 418 at OL31 is less than half the overlap of source region 216 at OL11 (shown in FIG. 5) and the overlap of drain region 420 at OL32 is less than half the overlap of drain region 218 at OL12.

Polysilicon layer 406 is situated on gate dielectric layer 404. In one example, the length Lps3 of polysilicon layer 406 is the same as the length Lgd3 of gate dielectric layer 404.

Floating gate dielectric layer 408 is disposed over polysilicon layer 406 and between polysilicon layer 406 and metal 1 layer 410. Floating gate dielectric layer 408 includes a USG layer 436 and a BPSG layer 438.

Metal 1 layer 410 is disposed on floating gate dielectric layer 408. Metal 1 layer 410 is a AlCuSi layer 440 on BPSG layer 438.

The floating gate of EPROM cell 400 includes polysilicon layer 406 connected to metal 1 layer 410. A break or hole in floating gate dielectric layer 408, including a break or hole in USG layer 436 and BPSG layer 438, allows metal 1 layer 410, including AlCuSi layer 440, to be electrically coupled to polysilicon layer 406. The floating gate is separated from substrate 402 by gate dielectric layer 404.

Semiconductor substrate 402, including N+ source region 418, N+ drain region 420, and p channel region 422, is similar to semiconductor substrate 302, including N+ source region 318, N+ drain region 320, and p channel region 322 (shown in FIG. 6), gate dielectric layer 404 is similar to gate dielectric layer 304 (shown in FIG. 6), polysilicon layer 406 is similar to polysilicon layer 306 (shown in FIG. 6), floating gate dielectric layer 408, including USG layer 436 and BPSG layer 438, is similar to floating gate dielectric layer 308, including USG layer 336 and BPSG layer 338 (shown in FIG. 6), and metal 1 layer 410 is similar to metal 1 layer 310 (shown in FIG. 6). The descriptions of semiconductor substrate 302, gate dielectric layer 304, polysilicon layer 306, floating gate dielectric layer 308, and metal 1 layer 310 herein also relate to semiconductor substrate 402, gate dielectric layer 404, polysilicon layer 406, floating gate dielectric layer 408, and metal 1 layer 410, respectively.

Floating gate charge retention layer 450 is disposed on metal 1 layer 410. Charge retention layer 450 is a dielectric nitride layer 452. Charge retention layer 450 prevents H+ mobile ions generated in control gate dielectric layer 412 from diffusing through control gate dielectric layer 412 and onto metal 1 layer 410. This prevents the annihilation of hot carriers or electrons on the floating gate by the H+ mobile ions and results in higher reliability and higher data retention as compared to EPROM cell 200 of FIG. 5 and as compared to EPROM cell 300 of FIG. 6. In one example, dielectric nitride layer 452 is SiN. In one example, dielectric nitride layer 452 is Si3N4. In one example, dielectric nitride layer 452 has a dielectric constant in a range of 7-7.5. In one example, dielectric nitride layer 452 is 1000 angstroms thick. In other examples, dielectric nitride layer 452 is another suitable dielectric nitride.

Control gate dielectric layer 412 is disposed on charge retention layer 450 and between charge retention layer 450 and metal 2 layer 414. Control gate dielectric layer 412 is a TEOS layer 442. In one example, TEOS layer 442 is 4000 angstroms thick.

Metal 2 layer 414 is disposed on control gate dielectric layer 412. Metal 2 layer 414 includes a TaAl layer 444 on TEOS layer 442 and an AlCu layer 446 on TaAl layer 444. Metal 1 layer 410 and metal 2 layer 414 provide addressing lines, such as row lines and column lines, and other connections in EPROM cell 400.

Top dielectric layer 416 is disposed on metal 2 layer 414. Top dielectric layer 416 is a Si3N4 and SiC layer 448. In packaging, a polymer layer (not shown) is disposed on top dielectric layer 416.

TEOS layer 442 is similar to TEOS layer 342 (shown in FIG. 6), metal 2 layer 414 is similar to metal 2 layer 314 (shown in FIG. 6), and top dielectric layer 416 is similar to top dielectric layer 316 (shown in FIG. 6). The descriptions of TEOS layer 342, metal 2 layer 314, and top dielectric layer 316 also relate to or describe TEOS layer 442, metal 2 layer 414, and top dielectric layer 416, respectively.

EPROM cell 400 includes capacitive coupling between metal 1 layer 410 and metal 2 layer 414, where metal 1 layer 410 and metal 2 layer 414 form parallel opposing capacitor plates. One capacitor plate is formed in metal 1 layer 410 and the other capacitor plate is formed in metal 2 layer 414. The capacitor plate formed in metal 2 layer 414 is the control gate of EPROM cell 400 and the capacitor plate formed in metal 1 layer 410 is part of the floating gate of EPROM cell 400. An input voltage Vin is applied to the capacitor plate formed in metal 2 layer 414, i.e., the control gate of EPROM cell 400, and capacitively coupled to the capacitor plate formed in metal 1 layer 410, i.e., the floating gate of EPROM cell 400. In one example, the control gate of EPROM cell 400 is similar to control gate 52 (shown in FIG. 1) and the floating gate of EPROM cell 400 is similar to floating gate 50 (shown in FIG. 1).

To program EPROM cell 400, a high input voltage pulse is applied to the control gate of EPROM cell 400 and to drain region 420, across drain region 420 to source region 418. This generates energetic "hot" carriers or electrons. A positive voltage bias between the control gate of EPROM cell 400 and drain region 420 pulls some of these hot electrons onto the floating gate of EPROM cell 400. As electrons are pulled onto the floating gate of EPROM cell 400, the threshold voltage of EPROM cell 400, i.e., the voltage required to cause channel region 422 to conduct current, increases. If enough electrons are pulled onto the floating gate of EPROM cell 400, the threshold voltage increases to a level above a specified threshold voltage and EPROM cell 400 substantially blocks current at the specified threshold voltage level, which changes the logic state of EPROM cell 400 from one logic value to the other logic value. Thus, EPROM cell 400 is programmed via hot carrier injection onto the floating gate of EPROM cell 400.

To read or sense the state of EPROM cell 400, the threshold voltage is detected and/or the on resistance is measured using a sensor (not shown). Reading or sensing the state of EPROM cell 400 can be done by setting the control gate voltage and the drain voltage of EPROM cell 400 and measuring the corresponding current or by setting the current and measuring the control gate and/or drain voltages. The measured on resistance of EPROM cell 400 changes by a factor of about 2 from an un-programmed state to a programmed state.

EPROM cell 400 is programmed via hot carrier injection onto the floating gate of EPROM cell 400. Floating gate charge retention layer 450 prevents the loss of hot carriers or charges from the floating gate. Charge retention layer 450 prevents H+ mobile ions generated in TEOS layer 442 from diffusing through TEOS layer 442 and onto metal 1 layer 410, which prevents the annihilation of hot carriers or electrons on the floating gate by H+ mobile ions. This results in higher reliability and data retention as compared to EPROM cell 200 of FIG. 5 and as compared to EPROM cell 300 of FIG. 6.

FIGS. 8-16 include results that show charge retention and/or programming ratio improvements in EPROM cells that include dielectric nitride layer 452, such as in EPROM cell 400 of FIG. 7. These are compared to EPROM cells, such as EPROM cell 200 of FIG. 5 and EPROM cell 300 of FIG. 6. Dielectric nitride layer 452 prevents charge loss and provides for sufficient charge retention.

Figure 8:
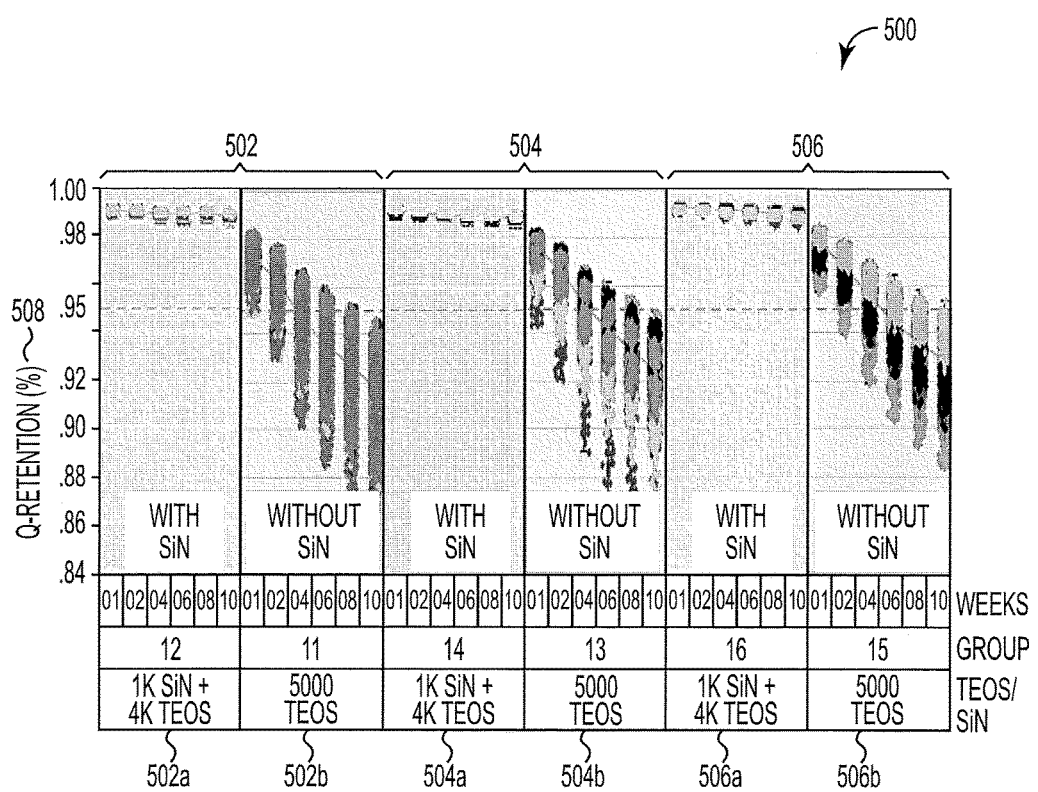
FIG. 8 is a diagram illustrating one example of a variability chart for charge retention.

FIG. 8 is a diagram illustrating one example of a variability chart for charge retention 500. Along the x-axis are three different process splits 502, 504, and 506. Each of the process splits 502, 504, and 506 includes EPROM cells with dielectric nitride layer 452, such as in EPROM cell 400, and EPROM cells without dielectric nitride layer 452, such as in EPROM cell 300. The percentage of charge retention is displayed along the y-axis at 508.

Process split 502 includes group 12 at 502a with dielectric nitride layer 452 and group 11 at 502b without dielectric nitride layer 452. In group 12 at 502a the thickness of dielectric nitride layer 452 is 1000 angstroms and the thickness of TEOS layer is 4000 angstroms. In group 11 at 502b the thickness of TEOS layer is 5000 angstroms. Where, thickness as used herein is the vertical dimension in FIGS. 5-7.

In group 12 at 502a, the percentage of charge retention remains above the 98% level from week 1 through week 10. In group 11 at 502b, the percentage of charge retention remains at or above the 95% level in week 1, but drops to between 95% and less than 88% in week 10. The allowable percentage of charge retention is 95%. Thus, EPROM cells in group 12 at 502a with dielectric nitride layer 452 retain sufficient charge, while EPROM cells in group 11 at 502b without dielectric nitride layer 452 fail to retain sufficient charge for adequate data retention. This pattern is repeated in process splits 504 and 506.

Process split 504 includes group 14 at 504a with dielectric nitride layer 452 and group 13 at 504b without dielectric nitride layer 452. In group 14 at 504a the thickness of dielectric nitride layer 452 is 1000 angstroms and the thickness of TEOS layer is 4000 angstroms. In group 13 at 504b the thickness of TEOS layer is 5000 angstroms.

In group 14 at 504a, the percentage of charge retention remains above the 98% level from week 1 through week 10. In group 13 at 504b, the percentage of charge retention remains above or slightly below the 95% level in week 1, but drops to between 95% and less than 88% in week 10. The allowable percentage of charge retention is 95%. Thus, EPROM cells in group 14 at 504a with dielectric nitride layer 452 retain sufficient charge, while EPROM cells in group 13 at 504b without dielectric nitride layer 452 fail to retain sufficient charge for adequate data retention.

Process split 506 includes group 16 at 506a with dielectric nitride layer 452 and group 15 at 506b without dielectric nitride layer 452. In group 16 at 506a the thickness of dielectric nitride layer 452 is 1000 angstroms and the thickness of TEOS layer is 4000 angstroms. In group 15 at 506b the thickness of TEOS layer is 5000 angstroms.

In group 16 at 506a, the percentage of charge retention remains above the 98% level from week 1 through week 10. In group 15 at 506b, the percentage of charge retention remains above the 95% level in week 1, but drops to between about 95% and just above 88% in week 10. The allowable percentage of charge retention is 95%. Thus, EPROM cells in group 16 at 506a with dielectric nitride layer 452 retain sufficient charge, while EPROM cells in group 15 at 506b without dielectric nitride layer 452 fail to retain sufficient charge for adequate data retention.

Figure 9:
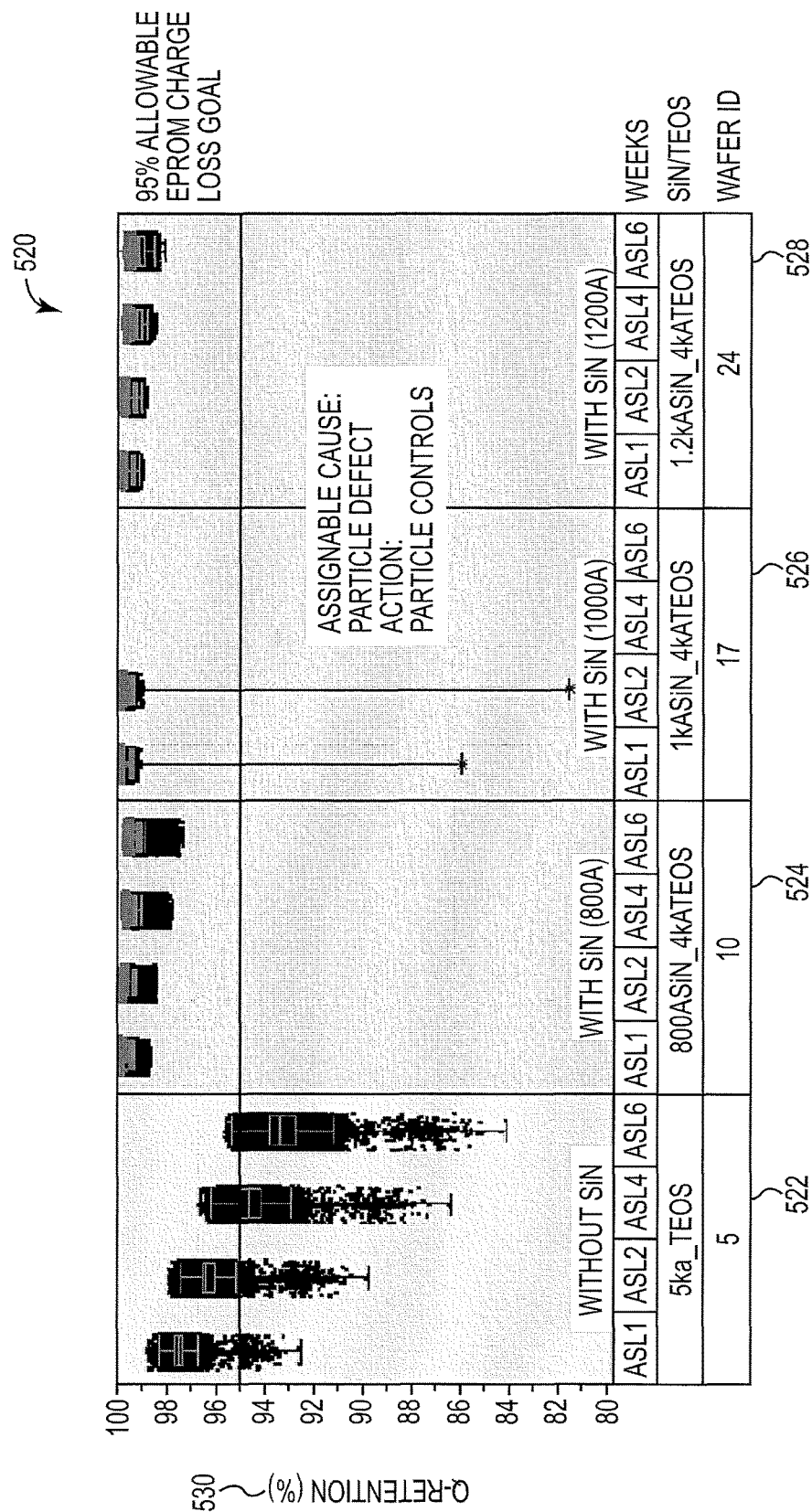
FIG. 9 is a diagram illustrating one example of a variability chart for charge retention including different thicknesses of a silicon nitride layer.

FIG. 9 is a diagram illustrating one example of a variability chart for charge retention 520 including different thicknesses of dielectric nitride layer 452 in EPROM cells, such as EPROM cell 400. Along the x-axis is wafer 5 at 522, including EPROM cells without dielectric nitride layer 452, such as in EPROM cell 300. Also, along the x-axis are three wafers, including wafer 10 at 524, wafer 17 at 526, and wafer 24 at 528, including EPROM cells with dielectric nitride layer 452, such as in EPROM cell 400. The percentage of charge retention is displayed along the y-axis at 530.

In wafer 5 at 522, which includes EPROM cells without dielectric nitride layer 452, the thickness of the TEOS layer is 5000 angstroms. In wafer 5 at 522, the percentage of charge retention is between 99% and 92% in week 1 and drops off to between above 95% to about 84% in week 6. The allowable percentage of charge retention, also referred to as the EPROM charge loss goal, is 95%. Thus, EPROM cells in wafer 5 at 522 fail to retain sufficient charge for adequate data retention from week 1 through week 6.

In wafer 10 at 524, which includes EPROM cells with dielectric nitride layer 452, the thickness of dielectric nitride layer 452 is 800 angstroms and the thickness of the TEOS layer is 4000 angstroms. In wafer 10 at 524, the percentage of charge retention is above 98% in week 1 and above 97% in week 6. The allowable percentage of charge retention is 95%. Thus, EPROM cells in wafer 10 at 524 retain sufficient charge for adequate data retention from week 1 through week 6.

In wafer 17 at 526, which includes EPROM cells with dielectric nitride layer 452, the thickness of dielectric nitride layer 452 is 1000 angstroms and the thickness of the TEOS layer is 4000 angstroms. In wafer 17 at 526, the percentage of charge retention is primarily above 98%. However, particle defects are found in the sample.

In wafer 24 at 528, which includes EPROM cells with dielectric nitride layer 452, the thickness of dielectric nitride layer 452 is 1200 angstroms and the thickness of the TEOS layer is 4000 angstroms. In wafer 24 at 528, the percentage of charge retention is above 98% in week 1 and above, about 98% in week 6. The allowable percentage of charge retention is 95%. Thus, EPROM cells in wafer 24 at 528 retain sufficient charge for adequate data retention from week 1 through week 6.

Figure 10:
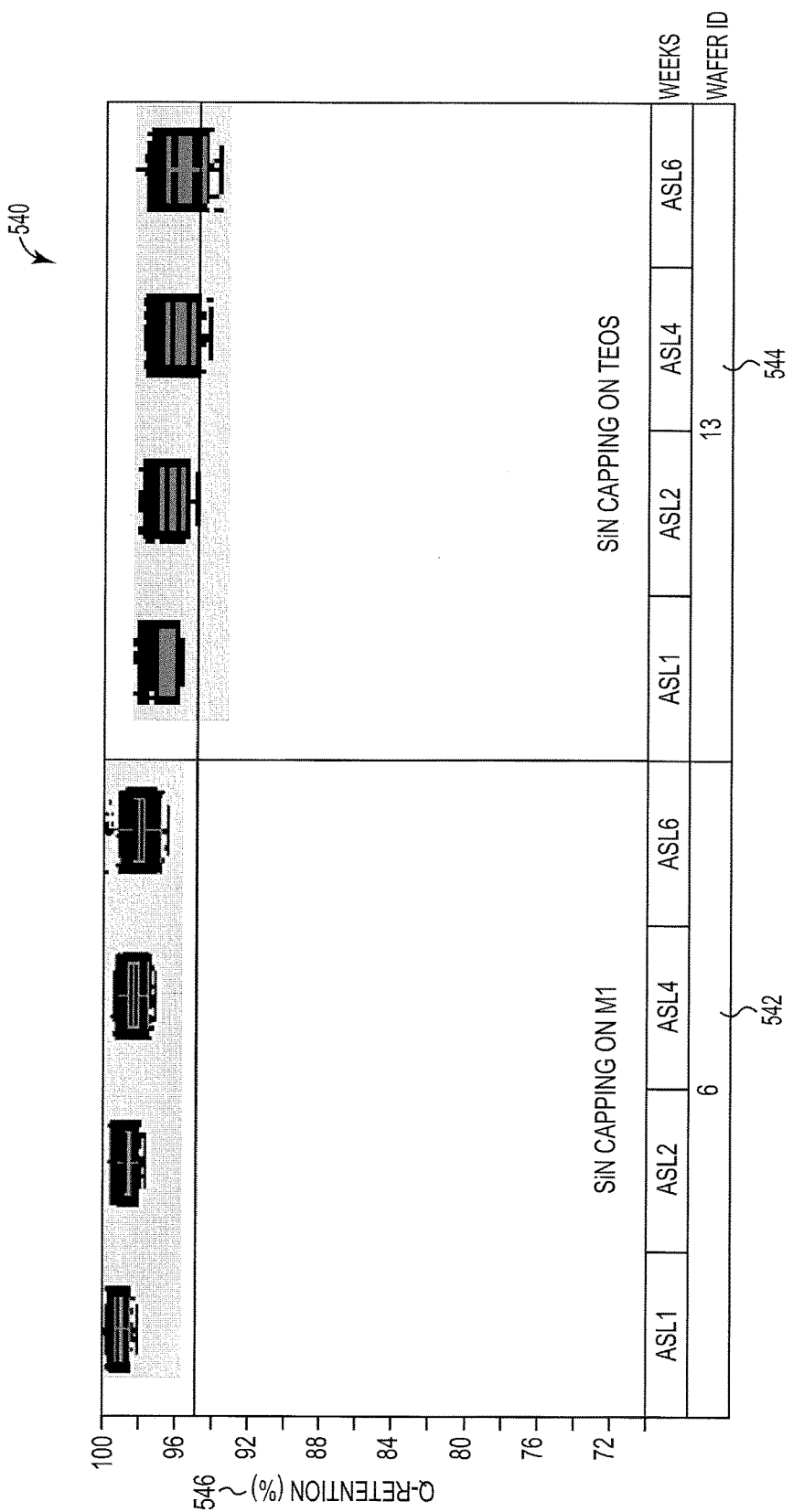
FIG. 10 is a diagram illustrating one example of a variability chart for charge retention comparing EPROM cells having a silicon nitride layer on the metal 1 layer to EPROM cells having a silicon nitride layer on the TEOS layer.

FIG. 10 is a diagram illustrating one example of a variability chart for charge retention 540 comparing EPROM cells having dielectric nitride layer 452 on the metal 1 layer, as in EPROM cell 400, to EPROM cells having a silicon nitride layer on the TEOS layer, instead of under the TEOS layer and on the metal 1 layer. Along the x-axis is wafer 6 at 542, including EPROM cells with dielectric nitride layer 452 on the metal 1 layer, such as in EPROM cell 400. Also, along the x-axis is wafer 13 at 544, including EPROM cells having a silicon nitride layer on the TEOS layer. The percentage of charge retention is displayed along the y-axis at 546.

In wafer 6 at 542, the percentage of charge retention is above 99% in week 1 and above 96% in week 6. The allowable percentage of charge retention is 95%. Thus, EPROM cells in wafer 6 at 542 retain sufficient charge for adequate data retention from week 1 through week 6.

In wafer 13 at 544, the percentage of charge retention is above 96% in week 1, but drops to between 98% and 92% in week 6. The allowable percentage of charge retention is 95%. Thus, EPROM cells in wafer 13 at 544 fail to retain sufficient charge for adequate data retention from week 1 through week 6.

Figure 11:
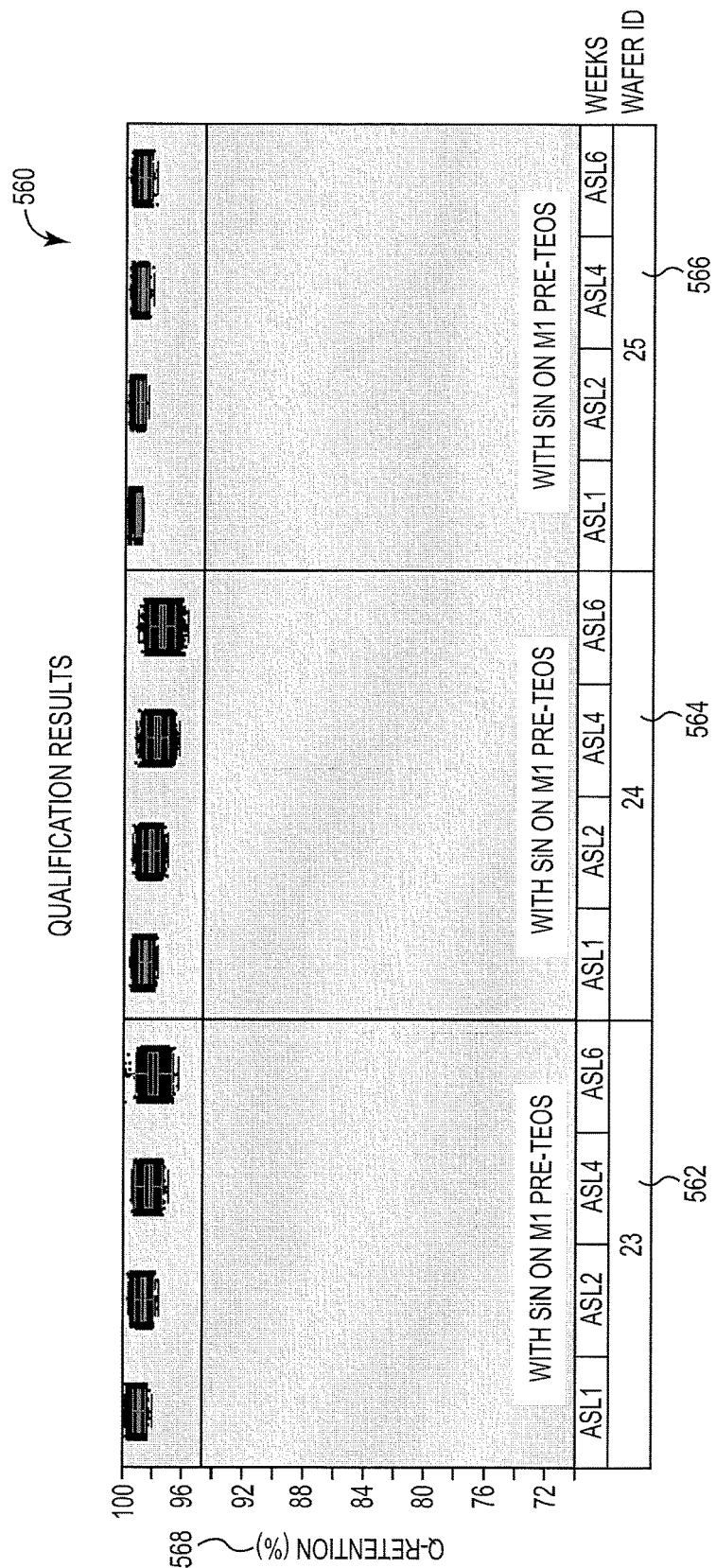
FIG. 11 is a diagram illustrating one example of a variability chart for charge retention for three qualification lots.

FIG. 11 is a diagram illustrating one example of a variability chart for charge retention 560 for three qualification lots. Along the x-axis are listed three wafers, including wafer 23 at 562, wafer 24 at 564, and wafer 25 at 566. Each of the qualification lot wafers at 562, 564, and 566 includes EPROM cells having dielectric nitride layer 452 on the metal 1 layer, as in EPROM cell 400. The percentage of charge retention is displayed along the y-axis at 568.

In each of the wafers, including wafer 23 at 562, wafer 24 at 564, and wafer 25 at 566, the percentage of charge retention is at or above 98% in week 1 and at or above 96% in week 6. The allowable percentage of charge retention is 95%. Thus, EPROM cells in each of the wafers, including wafer 23 at 562, wafer 24 at 564, and wafer 25 at 566, retain sufficient charge for adequate data retention from week 1 through week 6.

Figure 12:
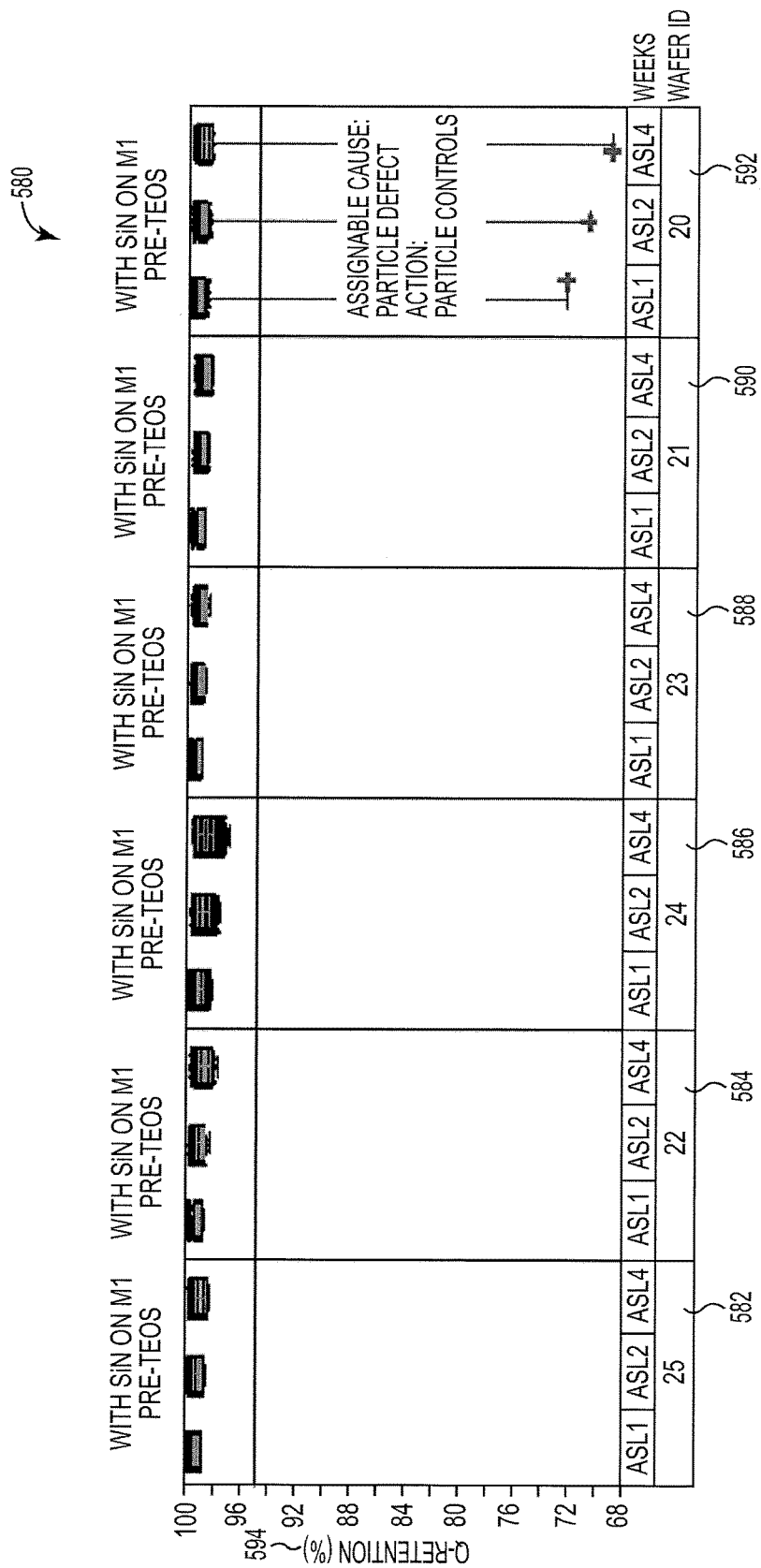
FIG. 12 is a diagram illustrating one example of a variability chart for charge retention for six risk production lots.

FIG. 12 is a diagram illustrating one example of a variability chart for charge retention 580 for six risk production lots. Along the x-axis are listed six wafers, including wafer 25 at 582, wafer 22 at 584, wafer 24 at 586, wafer 23 at 588, wafer 21 at 590, and wafer 20 at 592. Each of the risk production lot wafers at 582, 584, 586, 588, 590, and 592 includes EPROM cells having dielectric nitride layer 452 on the metal 1 layer, as in EPROM cell 400. The percentage of charge retention is displayed along the y-axis at 594.

In each of the wafers, including wafer 25 at 582, wafer 22 at 584, wafer 24 at 586, wafer 23 at 588, and wafer 21 at 590, the percentage of charge retention is at or above 98% in week 1 and at or above 96% in week 4. The allowable percentage of charge retention is 95%. Thus, EPROM cells in each of the wafers, including wafer 25 at 582, wafer 22 at 584, wafer 24 at 586, wafer 23 at 588, and wafer 21 at 590, retain sufficient charge for adequate data retention from week 1 through week 6.

In wafer 20 at 592, the percentage of charge retention is primarily above 98%. However, particle defects are found in the sample.

Figure 13:
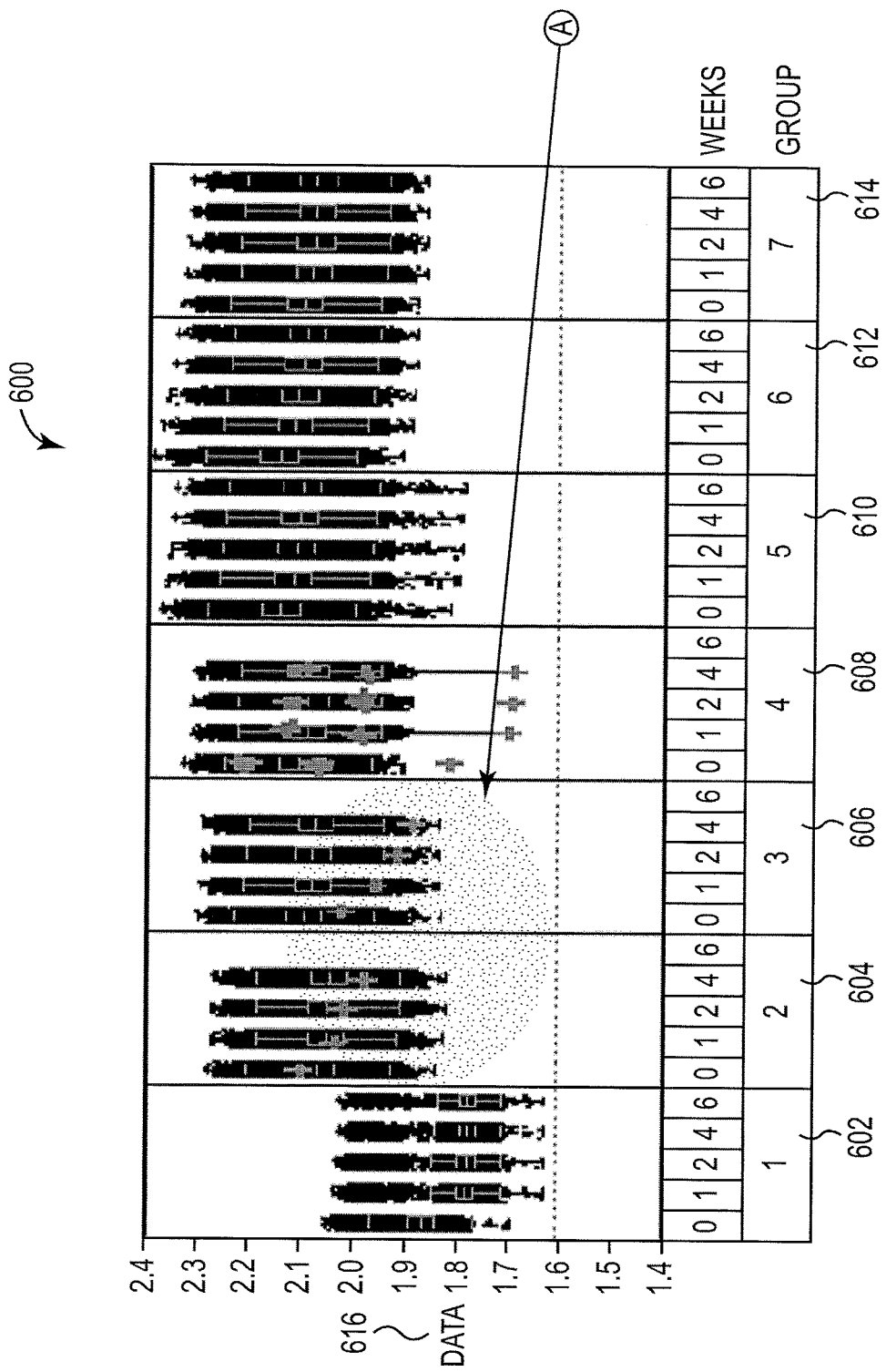
FIG. 13 is a diagram illustrating one example of an EPROM programming ratio data chart.

FIG. 13 is a diagram illustrating one example of an EPROM programming ratio data chart 600. Programming ratio data chart 600 compares programming ratio data for EPROM cells, such as EPROM cell 200 of FIG. 5, to EPROM cells having dielectric nitride layer 452 on the metal 1 layer, as in EPROM cell 400 of FIG. 7. Along the x-axis is group 1 at 602, including EPROM cells such as EPROM cell 200. Also, along the x-axis are six qualification groups, including group 2 at 604, group 3 at 606, group 4 at 608, group 5 at 610, group 6 at 612, and group 7 at 614. Each of the groups 2-7 includes EPROM cells with dielectric nitride layer 452 on the metal 1 layer, such as in EPROM cell 400. The programming ratio data is displayed along the y-axis at 616.

In group 1 at 602, which includes EPROM cells such as EPROM cell 200 of FIG. 5, the programming ratio is between 1.6 and just over 2.1 from week 0 through week 6. The programming ratio goal is 1.6. Thus, group 1 at 602 meets the programming ratio goal from week 0 through week 6, but is very close to failing.

In group 2 at 604, group 3 at 606, group 5 at 610, group 6 at 612, and group 7 at 614, the programming ratio is between 1.8 and 2.4 from week 0 through week 6. The programming ratio goal is 1.6, such that these groups exceed the programming ratio goal and show improvement over the programming ratios in group 1 at 602 from week 0 through week 6.

In group 4 at 608, the programming ratio is substantially between 1.8 and 2.3 from week 0 through week 6. However, particle defects are found in the sample.

Figure 14:
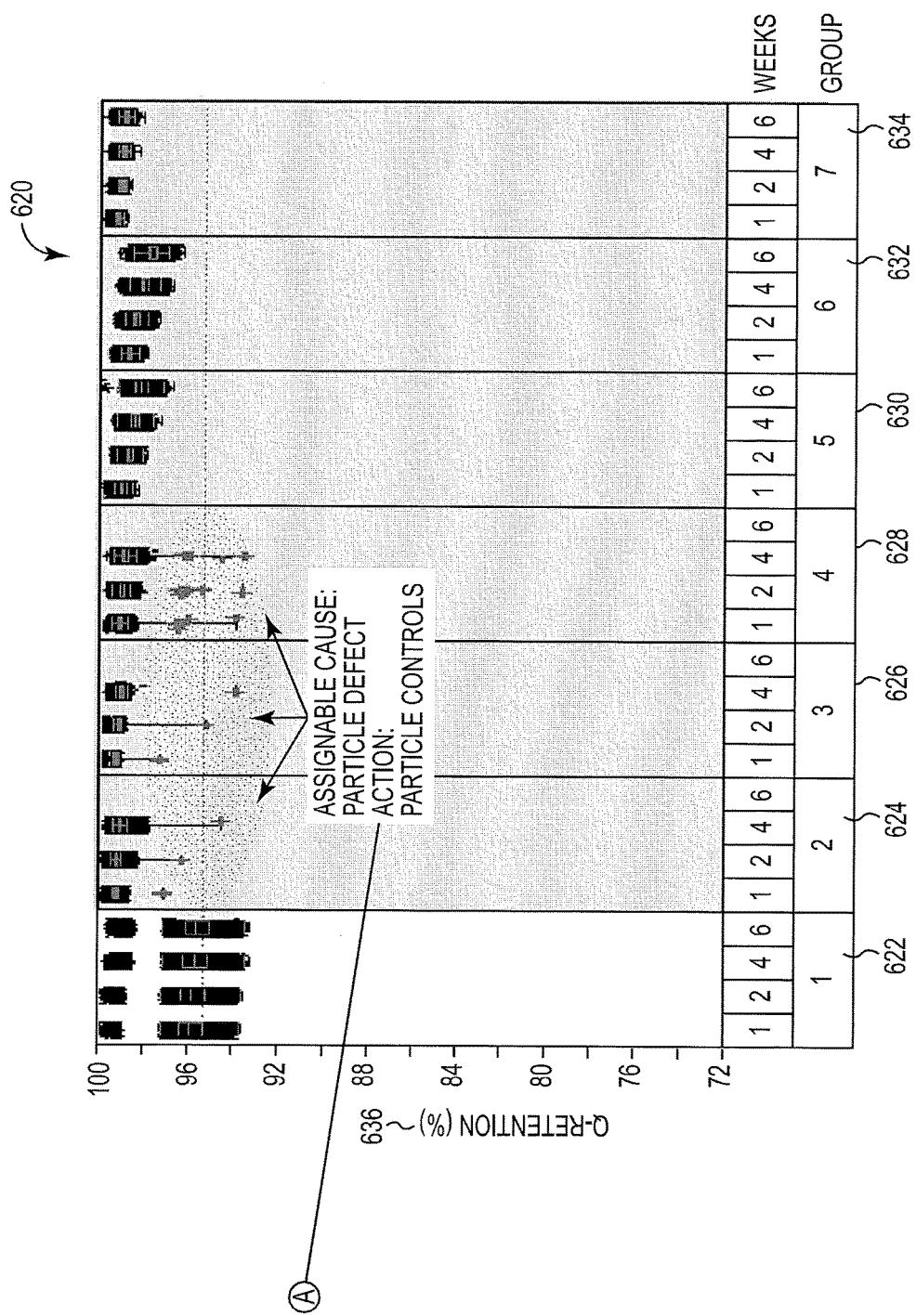
FIG. 14 is a diagram illustrating one example of a variability chart for charge retention comparing EPROM cells not having a silicon nitride layer to EPROM cells having a silicon nitride layer.

FIG. 14 is a diagram illustrating one example of a variability chart for charge retention 620 comparing EPROM cells, such as EPROM cell 200 of FIG. 5, to EPROM cells having dielectric nitride layer 452 on the metal 1 layer, such as in EPROM cell 400 of FIG. 7. Along the x-axis is group 1 at 622, including EPROM cells such as EPROM cell 200. Also, along the x-axis are six qualification groups, including group 2 at 624, group 3 at 626, group 4 at 628, group 5 at 630, group 6 at 632, and group 7 at 634. Each of the groups 2-7 includes EPROM cells with dielectric nitride layer 452 on the metal 1 layer, such as in EPROM cell 400. The percentage of charge retention is displayed along the y-axis at 636.

In group 1 at 622, the percentage of charge retention is 92% or more in weeks 1 through 6. The allowable percentage of charge retention or the charge loss goal is 95%. Thus, at least some of the EPROM cells in group 1 at 622 fail to retain sufficient charge for adequate data retention from week 1 through week 6.

In each of the groups including group 5 at 630, group 6 at 632, and group 7 at 634, the percentage of charge retention is at or above 98% in week 1 and at or above 96% in week 6. The allowable percentage of charge retention is 95%. Thus, EPROM cells in each of the groups, including group 5 at 630, group 6 at 632, and group 7 at 634, retain sufficient charge for adequate data retention from week 1 through week 6.

In each of the groups including group 2 at 624, group 3 at 626, and group 4 at 628, the percentage of charge retention is primarily at or above 98%. However, particle defects are found in the sample.

Figure 15:
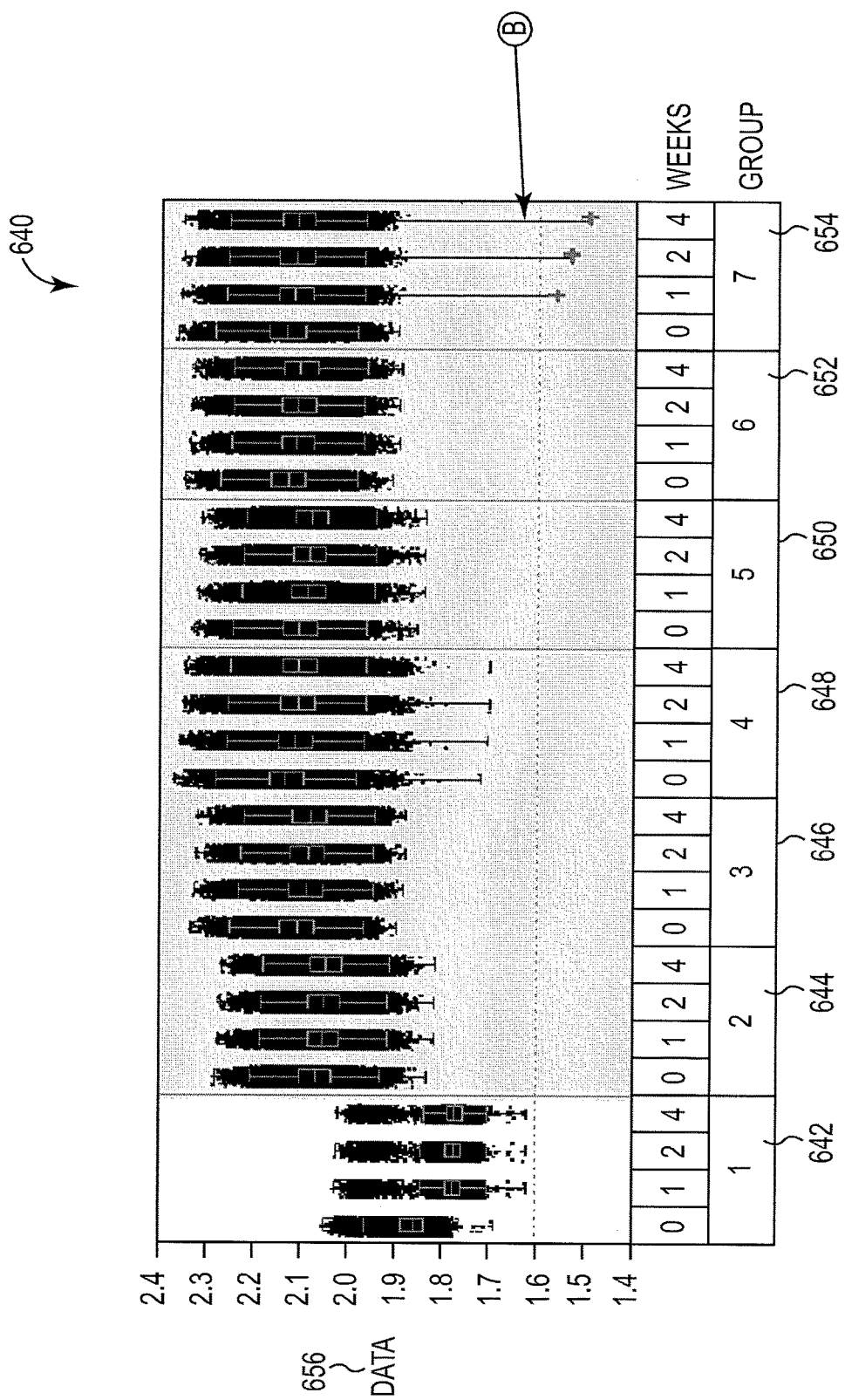
FIG. 15 is a diagram illustrating one example of an EPROM programming ratio data chart for risk production lots.

FIG. 15 is a diagram illustrating one example of an EPROM programming ratio data chart 640 for risk production lots. Programming ratio data chart 640 compares programming ratio data for EPROM cells, such as EPROM cell 200 of FIG. 5, to EPROM cells having dielectric nitride layer 452 on the metal 1 layer, as in EPROM cell 400 of FIG. 7. Along the x-axis is group 1 at 642, including EPROM cells such as EPROM cell 200. Also, along the x-axis are six risk production groups, including group 2 at 644, group 3 at 646, group 4 at 648, group 5 at 650, group 6 at 652, and group 7 at 654. Each of the groups 2-7 includes EPROM cells with dielectric nitride layer 452 on the metal 1 layer, such as in EPROM cell 400. The programming ratio data is displayed along the y-axis at 656.

In group 1 at 642, which includes EPROM cells such as EPROM cell 200 of FIG. 5, the programming ratio is between 1.6 and 2.1 from week 0 through week 4. The programming ratio goal is 1.6. Thus, group 1 at 642 meets the programming ratio goal from week 0 through week 4, but is very close to failing.

In group 2 at 644, group 3 at 646, group 5 at 650, and group 6 at 652, the programming ratio is between 1.8 and 2.4 from week 0 through week 4. In group 4 at 648, the programming ratio is between 1.7 and 2.4 from week 0 through week 4. The programming ratio goal is 1.6, such that these groups exceed the programming ratio goal and show improvement over the programming ratios in group 1 at 642 from week 0 through week 4.

In group 7 at 654, the programming ratio is substantially between 1.9 and 2.4 from week 0 through week 4. However, particle defects are found in the sample.

Figure 16:
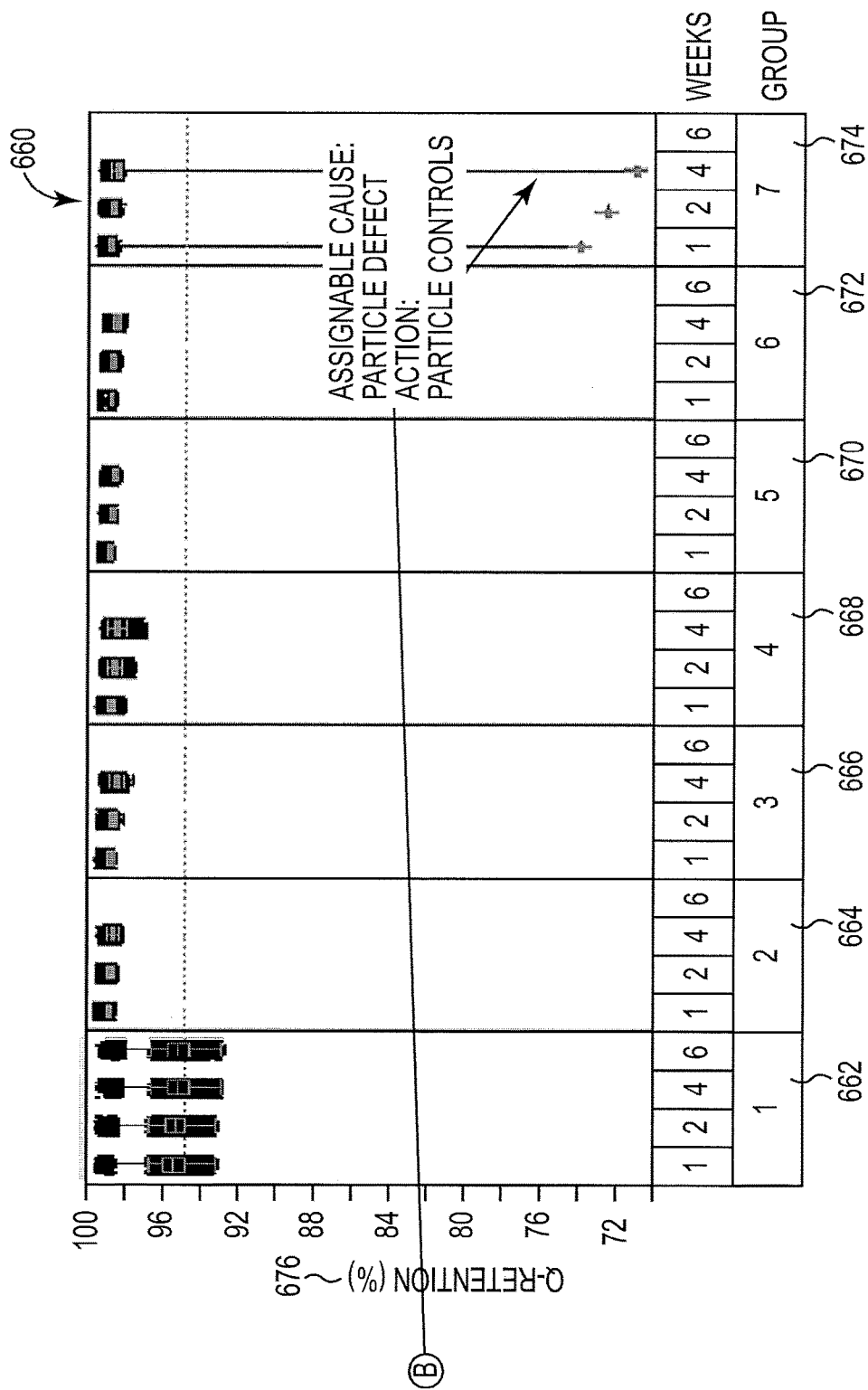
FIG. 16 is a diagram illustrating one example of a variability chart for charge retention for risk production lots.

FIG. 16 is a diagram illustrating one example of a variability chart for charge retention 660 for risk production lots. Variability chart 660 compares EPROM cells, such as EPROM cell 200 of FIG. 5, to EPROM cells having dielectric nitride layer 452 on the metal 1 layer, such as in EPROM cell 400 of FIG. 7. Along the x-axis is group 1 at 662, including EPROM cells such as EPROM cell 200. Also, along the x-axis are six risk production groups, including group 2 at 664, group 3 at 666, group 4 at 668, group 5 at 670, group 6 at 672, and group 7 at 674. Each of the groups 2-7 includes EPROM cells with dielectric nitride layer 452 on the metal 1 layer, such as in EPROM cell 400. The percentage of charge retention is displayed along the y-axis at 676.

In group 1 at 662, the percentage of charge retention is 92% or more in weeks 1 through 6. The allowable percentage of charge retention or the charge loss goal is 95%. Thus, at least some of the EPROM cells in group 1 at 662 fail to retain sufficient charge for adequate data retention from week 1 through week 6.

In each of the groups, including group 2 at 664, group 3 at 666, group 4 at 668, group 5 at 670, and group 6 at 672, the percentage of charge retention is at or above 98% in week 1 and at or above 96% in week 4. The allowable percentage of charge retention is 95%. Thus, EPROM cells in each of these groups retain sufficient charge for adequate data retention from week 1 through week 4.

In group 7 at 674, the percentage of charge retention is primarily at or above 98%. However, particle defects are found in the sample.

FIGS. 17-25 are diagrams illustrating one example of a method of manufacturing an EPROM cell 700, which is similar to EPROM cell 400 of FIG. 7. EPROM cell 700 is manufactured in an NMOS process. In one example, EPROM cell 700 is similar to EPROM cell 40 of FIG. 1. In one example, EPROM cell 700 is included in an inkjet printhead. In one example, EPROM cell 700 is included in an inkjet control chip. In one example, EPROM cell 700 is included in an inkjet printhead die.

Figure 17:
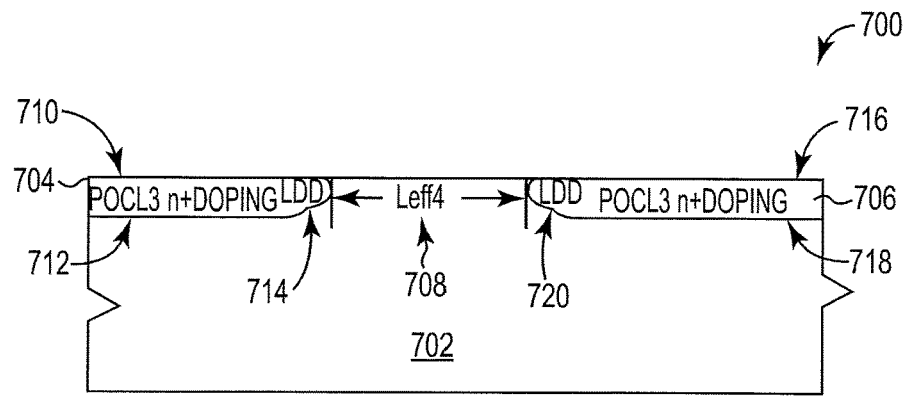
FIG. 17 is a diagram illustrating one example of a semiconductor substrate.

FIG. 17 is a diagram illustrating one example of a semiconductor substrate 702, including an N+ source region 704, an N+ drain region 706, and a p channel region 708 situated between source region 704 and drain region 706. Each of the source region 704 and the drain region 706 is manufactured in a LDD process. POCL3 provides an N+ doping agent for creating N+ source region 704 and N+ drain region 706. The LDD process provides a source region 704 that is not diffused or implanted as deeply in semiconductor substrate 702 as source region 216 is diffused or implanted in semiconductor substrate 202 (shown in FIG. 5). Also, the LDD process provides a drain region 706 that is not diffused or implanted as deeply in semiconductor substrate 702 as drain region 218 is diffused or implanted in semiconductor substrate 202 (shown in FIG. 5).

Source region 704 includes a top surface 710, a bottom 712, and sides 714 between top surface 710 and bottom 712. Drain region 706 includes a top surface 716, a bottom 718, and sides 720 between top surface 716 and bottom 718. Channel region 708 is situated between sides 714 of source region 704 and sides 720 of drain region 706. In one example, channel region 708 surrounds drain region 706 around sides 720 of drain region 706. In one example, sides 714 of source region 704 surround channel region 708. In one example, channel region 708 includes a closed curve structure around drain region 706, where a curve is defined as an object similar to a line, but not required to be straight, which entails that a line is a special case of a curve, namely a curve with null curvature. Also, a closed curve is defined as a curve that joins up and has no endpoints.

Channel region 708 has an effective channel length Leff4. In one example, the effective channel length Leff4 is the same as the effective channel length Leff1 of EPROM cell 200 of FIG. 5. In one example, Leff4 is 1-1.2 micrometers.

Figure 18:
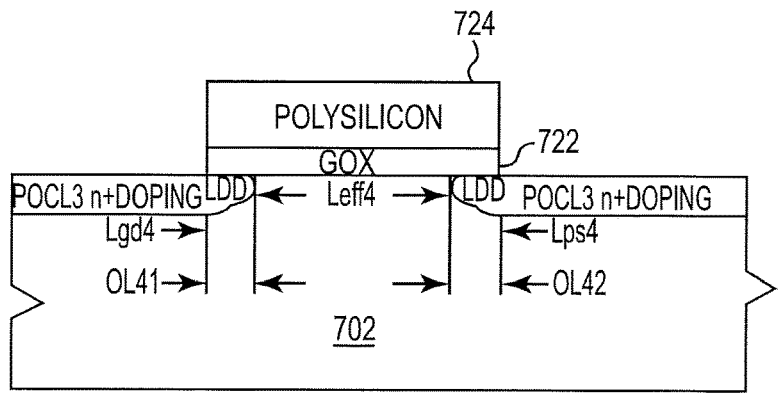
FIG. 18 is a diagram illustrating one example of a gate dielectric layer and a polysilicon layer disposed over the semiconductor substrate.

FIG. 18 is a diagram illustrating one example of a gate dielectric layer 722 and a polysilicon layer 724 disposed over substrate 702. Gate dielectric layer 722 is disposed and formed on substrate 702, and polysilicon layer 724 is disposed and formed on gate dielectric layer 722. In one example, the length Lps4 of polysilicon layer 724 is the same as the length Lgd4 of gate dielectric layer 722. In one example, gate dielectric layer 722 is a gate oxide layer. In one example, gate dielectric layer 722 is SiO2.

Gate dielectric layer 722 overlaps source region 704 at OL41 and gate dielectric layer 722 overlaps drain region 706 at OL42. The effective channel length Leff4 is two or more times longer than the overlap of source region 704 at OL41. Also, the effective channel length Leff4 is two or more times longer than the overlap of drain region 706 at OL42. In one example, OL41 is 0.4 micrometers and OL42 is 0.4 micrometers. In one example, the length Lgd4 of gate dielectric layer 722 is in a range from 1.8 micrometers to 2.0 micrometers.

EPROM cell 700 is smaller than EPROM cell 200 of FIG. 5 and EPROM cell 700 takes up less area on a semiconductor die than EPROM cell 200. The length Lgd4 of gate dielectric layer 722 is less than the length Lgd1 of gate dielectric layer 204 (shown in FIG. 5). This is due to the overlap of source region 704 at OL41 being less than half the overlap of source region 216 at OL11 (shown in FIG. 5) and the overlap of drain region 706 at OL42 being less than half the overlap of drain region 218 at OL12. Using EPROM cell 700 instead of EPROM cell 200 increases the packing density of EPROM cells on a semiconductor die and reduces the cost per bit of EPROM on the semiconductor die. In one example, the effective channel length Leff4 is the same or about the same as the effective channel length Leff1 of EPROM cell 200 of FIG. 2, and the overlap of source region 704 at OL41 is less than half the overlap of source region 216 at OL11 (shown in FIG. 5) and the overlap of drain region 706 at OL42 is less than half the overlap of drain region 218 at OL12.

Figure 19:
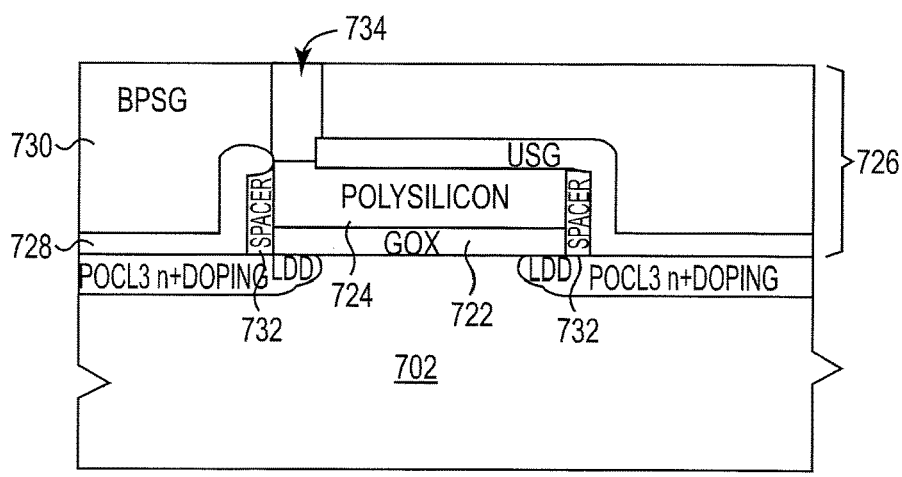
FIG. 19 is a diagram illustrating one example of a floating gate dielectric layer disposed over the polysilicon layer.

FIG. 19 is a diagram illustrating one example of a floating gate dielectric layer 726 disposed over polysilicon layer 724. Floating gate dielectric layer 726 includes a USG layer 728 and a BPSG layer 730. A spacer 732 is disposed along both sides of gate dielectric layer 722 and polysilicon layer 724. USG layer 728 is disposed on polysilicon layer 724 and on spacer 732 and on semiconductor substrate 702 in an atmospheric pressure chemical vapor deposition process. BPSG layer 730 is disposed on USG layer 728 at about 820 degrees centigrade. A break or hole at 734 is made in floating gate dielectric layer 726, including USG layer 728 and BPSG layer 730, for metal 1 layer 736.

The atmospheric pressure chemical vapor deposition process of USG layer 728 is more cost effective than the low pressure chemical vapor deposition of SDReox layer 234, which reduces the cost of EPROM cell 700 as compared to EPROM cell 200 of FIG. 5. Disposing BPSG layer 730 at 820 degrees centigrade, instead of disposing PSG layer 236 at 1000 degrees centigrade, provides better control over the depth of N+ source region 704 and N+ drain region 706, better control over the effective channel length Leff4, and better control over overlapping of source region 704 and drain region 706 with gate dielectric layer 722, as compared to EPROM cell 200 of FIG. 5.

Figure 20:
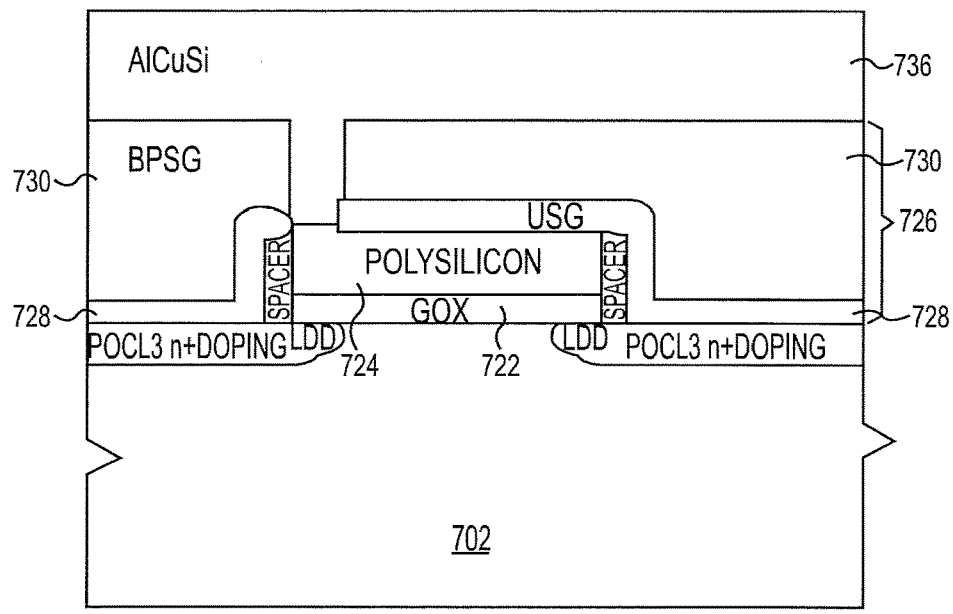
FIG. 20 is a diagram illustrating one example of a metal 1 layer disposed on the floating gate dielectric layer.

FIG. 20 is a diagram illustrating one example of metal 1 layer 736 disposed on floating gate dielectric layer 726. Metal 1 layer 736 is an AlCuSi layer 736 disposed on BPSG layer 730. The TaAl layer 238 of metal 1 layer 210 (shown in FIG. 5) is not in EPROM cell 700, which reduces the cost of EPROM cell 700 as compared to EPROM cell 200 of FIG. 5.

The floating gate of EPROM cell 700 includes polysilicon layer 724 connected to metal 1 layer 736. The break or hole at 734 in floating gate dielectric layer 726 allows AlCuSi layer 736 to be electrically coupled to polysilicon layer 724. The floating gate is separated from substrate 702 by gate dielectric layer 722.

Figure 21:
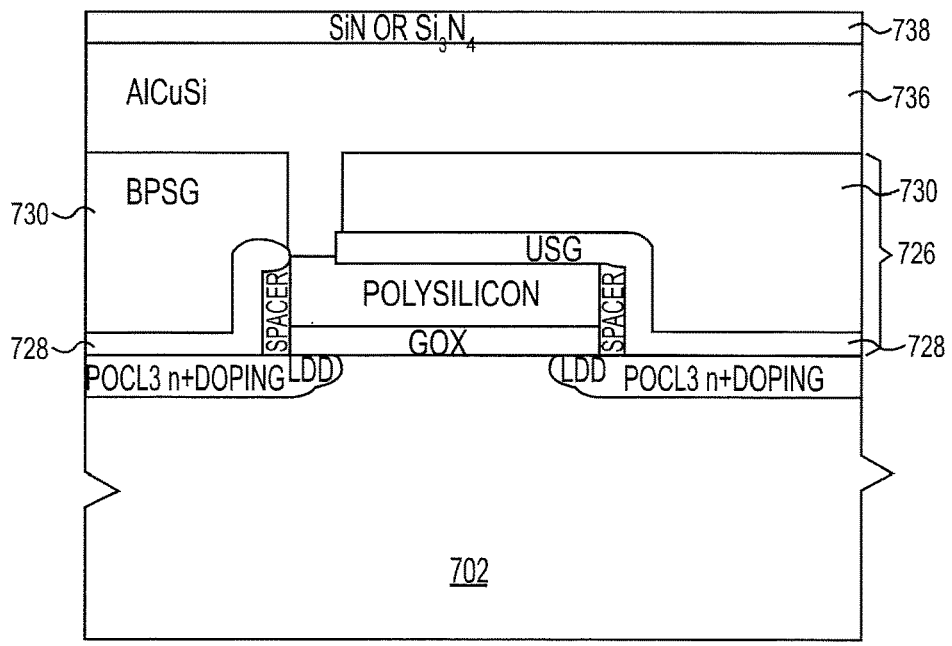
FIG. 21 is a diagram illustrating one example of a floating gate charge retention layer disposed on the metal 1 layer.

FIG. 21 is a diagram illustrating one example of a floating gate charge retention layer 738 disposed on metal 1 layer 736. Charge retention layer 738 is a silicon nitride layer 738. In one example, silicon nitride layer 738 is SiN. In one example, silicon nitride layer 738 is Si3N4. In one example, silicon nitride layer 738 has a dielectric constant in a range of 7-7.5. In one example, silicon nitride layer 738 is 1000 angstroms thick.

Figure 22:
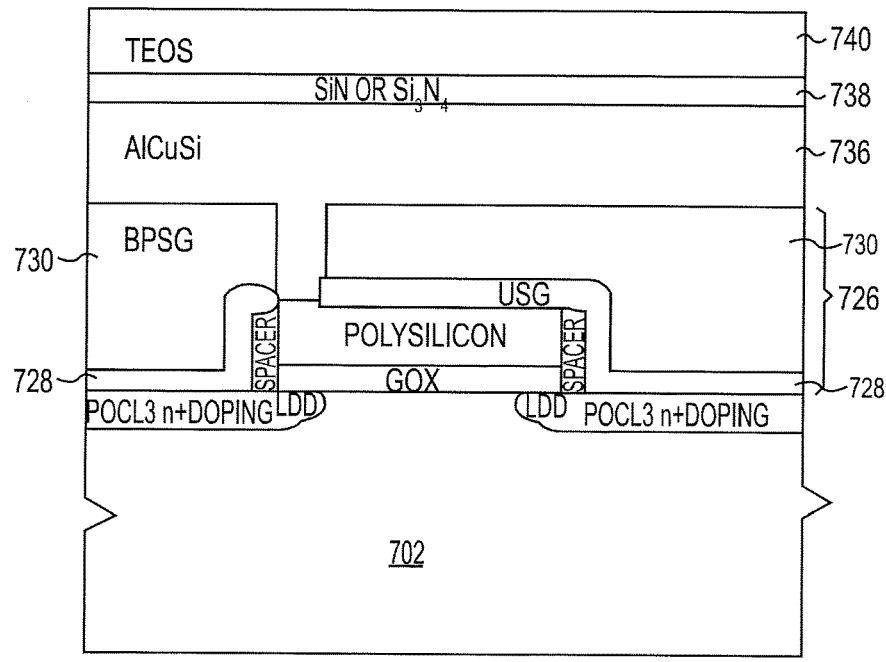
FIG. 22 is a diagram illustrating one example of a control gate dielectric layer disposed on the floating gate charge retention layer.

FIG. 22 is a diagram illustrating one example of a control gate dielectric layer 740 disposed on silicon nitride layer 738. Control gate dielectric layer 740 is a TEOS layer 740. Disposing TEOS layer 740 on silicon nitride layer 738 can be done at a lower temperature and is less expensive than disposing the Si3N4 and SiC layer 242 on metal 1 layer 210 (shown in FIG. 5). This reduces the cost of EPROM cell 700 as compared to EPROM cell 200 of FIG. 5 and provides better control over the depth of N+ source region 704 and N+ drain region 706, better control over the effective channel length Leff4, and better control over overlapping of source region 704 and drain region 706 with gate dielectric layer 720, as compared to EPROM cell 200 of FIG. 5. In one example, TEOS layer 740 has a dielectric constant of about 4.2. In one example, TEOS layer 740 is 4000 angstroms thick Charge retention layer 738 prevents H+ mobile ions generated in TEOS layer 740 from diffusing through TEOS layer 740 and onto metal 1 layer 736. This prevents the annihilation of hot carriers or electrons on the floating gate by the H+ mobile ions and results in higher reliability and higher data retention as compared to EPROM cell 200 of FIG. 5 and as compared to EPROM cell 300 of FIG. 6.

Figure 23:
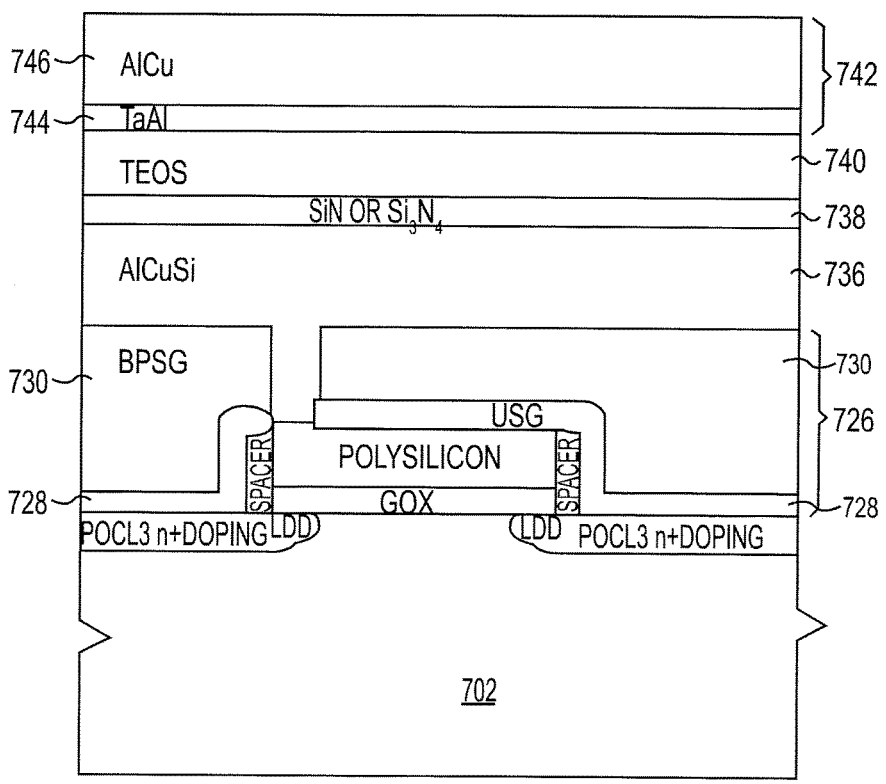
FIG. 23 is a diagram illustrating one example of a metal 2 layer disposed on the control gate dielectric layer.

FIG. 23 is a diagram illustrating one example of a metal 2 layer 742 disposed on control gate dielectric layer 740. Metal 2 layer 742 includes a TaAl layer 744 disposed on TEOS layer 740 and an AlCu layer 746 disposed on TaAl layer 744. Metal 2 layer 742 does not include a gold layer, such as Au layer 246, which reduces the cost of EPROM cell 700 as compared to EPROM cell 200 of FIG. 5. Metal 1 layer 736 and metal 2 layer 742 provide addressing lines, such as row lines and column lines, and other connections in EPROM cell 700.

Figure 24:
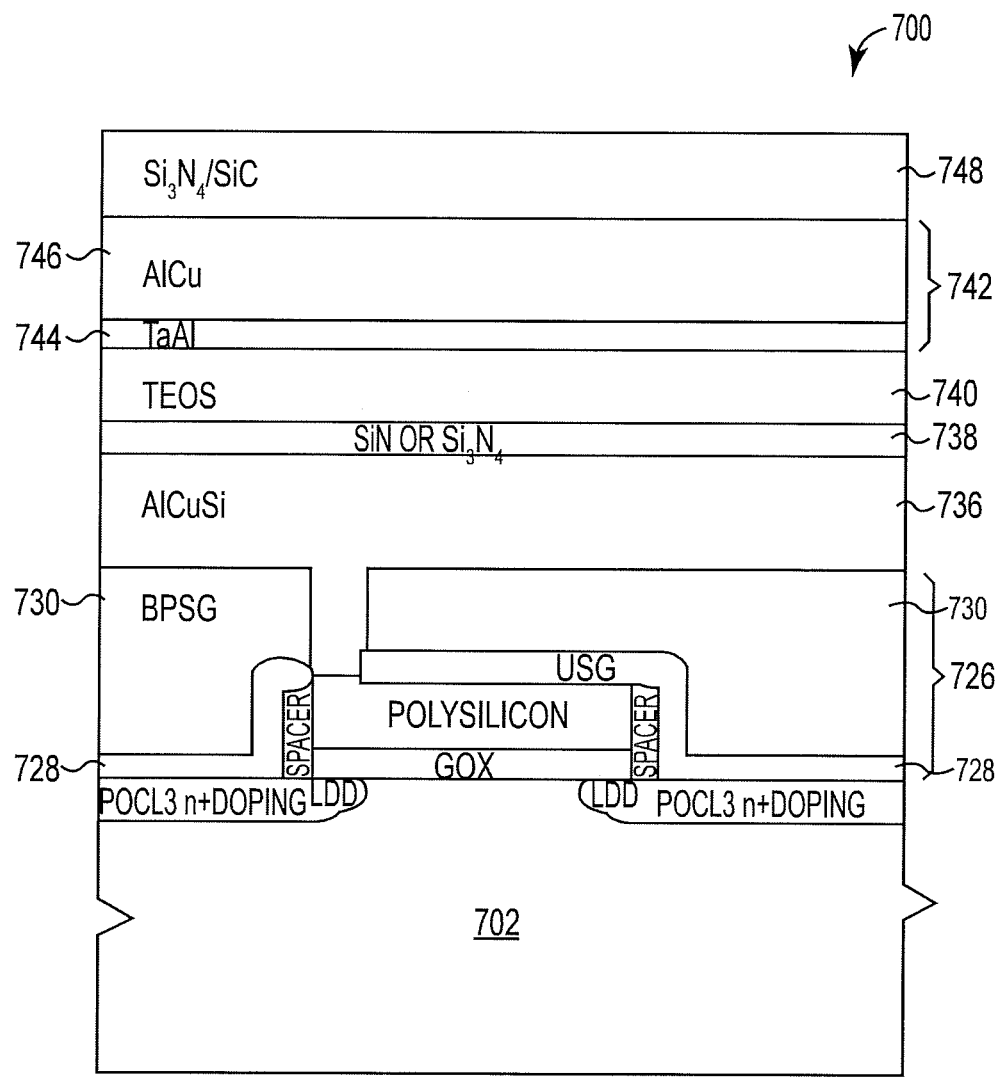
FIG. 24 is a diagram illustrating one example of a top dielectric layer disposed on the metal 2 layer.

FIG. 24 is a diagram illustrating one example of a top dielectric layer 748 disposed on metal 2 layer 742. Top dielectric layer 748 is a Si3N4 and SiC layer 748 disposed on AlCu layer 746. Top dielectric layer 316 protects EPROM cell 700 from degradation, such as oxidation, particle contamination, and other environmental degradation. In one example, Si3N4 and SiC layer 748 has a dielectric constant of about 6.8.

Figure 25:
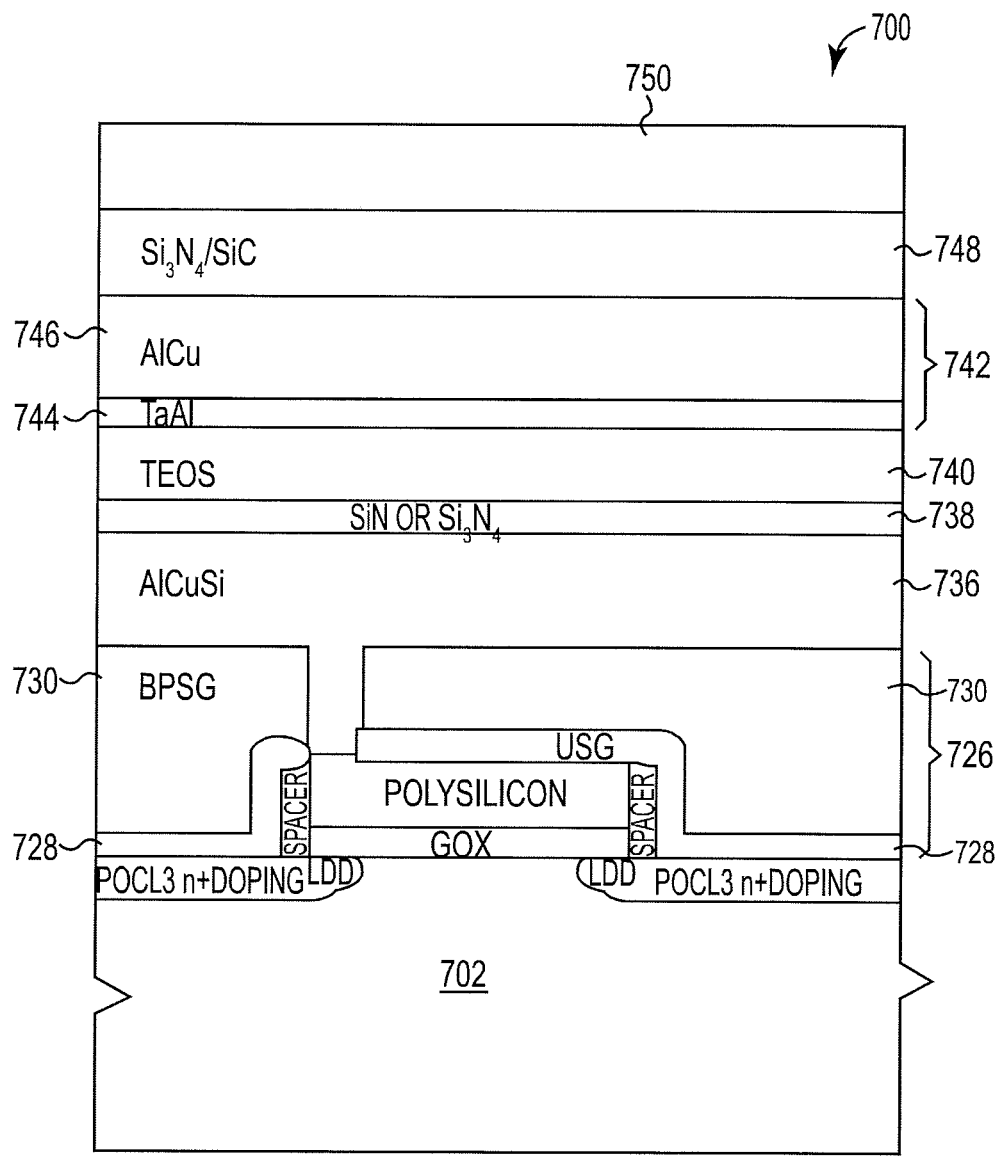
FIG. 25 is a diagram illustrating one example of a polymer layer disposed on the top dielectric layer.

FIG. 25 is a diagram illustrating one example of a polymer layer 750 disposed on Si3N4 and SiC layer 748. The Si3N4 and SiC layer 748 provides better adhesion to the polymer layer 750 than Au layer 246 (shown in FIG. 5), which improves reliability of EPROM cell 700 over EPROM cell 200 and opens up the use of more corrosive fluids, such as more corrosive inks, in a fluid ejection system.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A fluid ejection device comprising:
    a substrate; and
    a memory cell formed on the substrate and comprising:
        a channel region formed in the substrate between a drain region and a source region;
        a first dielectric layer over the channel region;
        a floating gate capacitively coupled to the channel region through the first dielectric layer, the floating gate comprising a polysilicon layer, a metal layer, and a second dielectric layer between the polysilicon layer and the metal layer, wherein the second dielectric layer includes an opening through which the polysilicon layer is electrically connected to the metal layer;
        a third dielectric layer over the floating gate;
        a control gate capacitively coupled to the floating gate through the third dielectric layer; and
        a dielectric nitride layer between the floating gate and the third dielectric layer to prevent charge loss from the floating gate to the third dielectric layer.

2. The fluid ejection device of claim 1, wherein the dielectric nitride layer is between the metal layer and the third dielectric layer.

3. The fluid ejection device of claim 2, wherein the metal layer includes aluminum copper silicon, and the third dielectric layer includes tetraethyl orthosilicate (TEOS).

4. The fluid ejection device of claim 1, wherein the second dielectric layer includes an un-doped silicon glass layer.

5. The fluid ejection device of claim 1, wherein the second dielectric layer includes a boron phosphor silicon glass layer.

6. The fluid ejection device of claim 1, wherein the control gate includes an aluminum copper layer.

7. The fluid ejection device of claim 1, wherein the memory cell comprises:
    a fourth dielectric layer on the control gate, wherein the fourth dielectric layer includes silicon nitride and silicon carbide to protect the memory cell from degradation and provide adhesion to a polymer layer.

8. The fluid ejection device of claim 1, comprising an array of memory cells, wherein the memory cell is part of the array of memory cells.

9. The fluid ejection device of claim 8, comprising addressing lines to select access of the memory cells in the array of memory cells.

10. The fluid ejection device of claim 9, wherein the addressing lines comprise row lines and column lines, and the array of memory cells comprise:
    row transistors selectively activatable by the row lines, and
    column transistors selectively activatable by the column lines.

11. The fluid ejection device of claim 1, comprising a printhead die, wherein the substrate and the memory cell is part of the printhead die.

12. The fluid ejection device of claim 11, wherein the printhead die comprises nozzles to dispense printing fluid.

13. A fluid ejection device comprising:
    a substrate; and
    an array of memory cells on the substrate, wherein a first memory cell of the array of memory cells comprises:
        a control gate;
        a first dielectric layer under the control gate;
        a floating gate capacitively coupled to the control gate through the first dielectric layer, the floating gate comprising a polysilicon layer, a metal layer, and a second dielectric layer between the polysilicon layer and the metal layer, wherein the second dielectric layer includes an opening through which the polysilicon layer is electrically connected to the metal layer;
        a third dielectric layer under the floating gate; and
        a channel region capacitively coupled to the floating gate through the third dielectric layer and between a drain region and a source region, wherein the drain region overlaps the third dielectric layer a first distance, and the source region overlaps the third dielectric layer a second distance such that an effective length of the channel region between the drain region and the source region is greater than or equal to a sum of the first distance and the second distance.

14. The fluid ejection device of claim 13, wherein the second dielectric layer includes a boron phosphor silicon glass layer between the polysilicon layer and the metal layer.

15. The fluid ejection device of claim 13, wherein the second dielectric layer includes an un-doped silicon glass layer between the polysilicon layer and the metal layer.

16. The fluid ejection device of claim 13, comprising a dielectric nitride layer between the floating gate and the first dielectric layer to prevent charge loss from the floating gate to the first dielectric layer.

17. The fluid ejection device of claim 13, wherein the array of memory cells comprises row transistors selectively activatable by row address lines, and column transistors selectively activatable by column address lines.

18. A printhead comprising:
a substrate; and
a memory cell on the substrate and comprising:
- a channel region formed in the substrate between a drain region and a source region;
- a first dielectric layer over the channel region;
- a floating gate capacitively coupled to the channel region through the first dielectric layer, the floating gate comprising a polysilicon layer, a metal layer, and a second dielectric layer between the polysilicon layer and the metal layer, wherein the second dielectric layer includes an opening through which the polysilicon layer is electrically connected to the metal layer;
- a third dielectric layer over the floating gate; and
- a control gate capacitively coupled to the floating gate through the third dielectric layer.

19. The printhead of claim 18, comprising a die including the substrate and the memory cell formed on the substrate.

20. The printhead of claim 18, wherein the second dielectric layer comprises at least one layer selected from among a boron phosphor silicon glass layer and an un-doped silicon glass layer.

* * * * *